United States Patent [19]

Perera et al.

[11] Patent Number: 4,633,471

[45] Date of Patent: * Dec. 30, 1986

[54] ERROR DETECTION AND CORRECTION IN AN OPTICAL STORAGE SYSTEM

[75] Inventors: S. Robert Perera; Michael J. O'Keeffe, both of Boulder County, Colo.

[73] Assignee: Storage Technology Partners II, Louisville, Colo.

[*] Notice: The portion of the term of this patent subsequent to Dec. 31, 2002 has been disclaimed.

[21] Appl. No.: 533,827

[22] Filed: Sep. 19, 1983

[51] Int. Cl.⁴ .............................................. G06F 11/10
[52] U.S. Cl. ......................................... 371/38; 371/39
[58] Field of Search .............................. 371/38, 37, 39

[56] References Cited

U.S. PATENT DOCUMENTS

| | | | |
|---|---|---|---|
| 4,105,999 | 8/1978 | Nakamura | 371/37 |
| 4,359,772 | 11/1982 | Patel | 371/39 |
| 4,413,339 | 11/1983 | Riggle et al. | 371/38 |

*Primary Examiner*—Charles E. Atkinson
*Attorney, Agent, or Firm*—Woodcock Washburn Kurtz Mackiewicz & Norris

[57] ABSTRACT

A self-checking shared encoder/decoder circuit for use with a Reed-Solomon coding scheme of an optical disk storage system. The optical disk system includes a drive adapted to permanently store data on a removable platter. Prior to recording a data byte on the platter, the data is encoded with a Reed-Solomon code. When the data is read from the disk, it is decoded and error correction syndromes are generated. A plurality of syndrome buffer registers are provided in order to allow several of the error correction functions to be carried out in parallel. Syndromes that are detected to comprise all zeros are used to simplify the error correction processes beyond the normal processes used. The same circuitry is shared for performing the encoding and decoding functions. This circuitry includes independent sets of a RAM, coupled to one input of an exclusive OR (modulo two sum) adding circuit. The output of the adding circuit is fed back to an input of the RAM. Two multiplier circuits are coupled to the output of the RAM. A product of one is tied to one input of the modulo two addition circuit. The product of the other is combined with similar products from other sets, and the resulting combination signal is selectively connected to the other input of the modulo two addition circuit, along with data to be recorded on the platter, or data read from the platter.

17 Claims, 14 Drawing Figures

ERROR DETECTION AND CORRECTION IN AN OPTICAL STORAGE SYSTEM

BACKGROUND OF THE INVENTION

This invention relates to optical data storage systems, and more particularly to a means for efficiently effectuating error detection and correction within such an optical data storage system.

Over the past two decades or so, there have been two maor trends in the data processing industry that have worked together to revolutionize the way that information is gathered, stored, and interpreted. The first trend has been the expansion of technological sophistication, as exemplified by the microcomputer chip. That is, computing power, which once required rooms full of equipment and kilowatts of electrical power to operate, can now be found in very small silicon chips. The second trend has been the cost of purchasing such computing power. Particularly in the area of memory—as costs have dropped and capacities have increased—there has been an inevitable rush to take advantage of the new-found memory space and fill it with information. In this respect, the demand for more memory and storage space has always seemed to outstretch the available supply of such memory space.

Unfortunately, for users with exceptionally large data storage needs, the magnetic-based storage peripheral devices adapted for use with high performance computers (i.e., magnetic tape and disk drives) have not been able to fill the need for more storage space. Traditionally, the need for more storage space in such large data storage systems has been addressed by merely adding additional magnetic disk drives and/or magnetic tape drives. This has been costly both in terms of expense (purchase/lease price plus maintenance costs) and floor space. Moreover, even though there have been some significant strides in recent years with respect to increasing the data storage capacity of these magnetic-based storage devices, the theoretical design limits of such systems are rapidly being approached. Hence, merely adding more magnetic disk or tape drives is no longer viewed as a practical alternative to the ever increasing need for storing more and more information. It is therefore apparent that a new type of data storage system is needed in order to handle the large amounts of data that information users need to store.

Optical technology—that is, the technology of using a laser beam to burn or otherwise mark very small holes on a suitable medium in a pattern representative of the data to be stored, which pattern can subsequently be read by monitoring a laser beam directed through or reflected off of the previously recorded marks—has been available in laboratories for some time. Unfortunately, however, such laboratory technology has not provided a cost effective alternative for use in data storage products. This is because the optical components have tended to occupy entire rooms and the power associated with operating the laser and associated components has been enormous. Further, such laboratory systems are not easily interfaced with existing high performance computer systems. That is, the techniques used to format and input the data have been incompatible with more conventional formatting and data processing techniques used in the magnetic-based storage systems. Moreover, the few optical storage systems that have been commercially introduced in the last few years have primarily related to the storing of video signals (image storing devices) as opposed to the storing of digital information. Further, the few digital optical storage devices that do exist do not represent a viable alternative or supplement to the existing peripheral magnetic-based storage devices for the user of large data bases of information.

A continuing problem that has existed with whatever type of data storage system is used is the problem of minimizing the errors that occur during read or write. The number of errors that occur in such a system is typically measured by a parameter referred to as the "bit error rate." This parameter is typically expressed as a number indicating the number of good bits of digital data that can be obtained for every bad bit of data that occurs. Thus, a bit error rate of 100,000 (10E+5) indicates that 100,000 bits of data can be read or pllayed back before a bad or incorrect bit of data will be encountered. In order to provide a viable data storage system, bit error rates in excess of 10E+12 are desired.

Numerous Error Correction codes (ECC) and similar error correcting schemes are known in the art in order to improve the bit error rate of data processing systems. The very existence of such ECC schemes evidences the continuing and recurring problem of reducing errors that are introduced into such processing systems. Unfortunately, the hardware realization of such ECC schemes can become quite complex and expensive to implement. Because of this complexity, additional errors may be generated as the data is handled and processed by the operation of this circuitry. However, many of the error correction algorithms must be carried out in the host CPU, thereby consuming valuable host CPU time. What few error correction processes can be carried out remote to the host CPU must be performed serially, thereby slowing down the rate at which data may be read.

Errors can principally originate from one of three sources: (1) the write channel (i.e., the data is written incorrectly); (2) the read channel (i.e., the data is read incorrectly); or (3) the storage medium (i.e., even though the data is initially written correctly, the storage medium may change with time so as to alter the data to make it incorrect). Of these three potential sources of error, most known ECC schemes for use with peripheral data storage systems are directed only to correcting errors that occur in the read channel. Sources of error introduced by aging media, item (3) above, are minimized in magnetic-based storage devices by merely re-writing the data after a prescribed period of time. (This technique is commonly referred to as "refreshing.") That is, the old data is read, stored in a buffer memory, the media is erased, and the old data is then rewritten on the media as though it were new data. This refreshing technique is, of course, only available when erasable media is used. Optical media, on the otherhand, is generally not considered erasable because of the manner in which the marks are permanently placed on the media by the laser beam. (Once a hole or pit or other mark is burned or ablated on the media by the laser beam, it is difficult to remove that hole or pit or mark.) However, over time, the media may "flow" or other changes may occur thereto so that the hole, pit, or other mark is somehow altered to the degree that light reflected therefrom might be incorrectly sensed.

With optical digital data recording, the integrity—or correctness—of data must be maintained to the same degree of perfection as it is with other digital data storage devices. Thus, care must be taken to ensure coded data is written correctly, and that once written, the data is read back correctly later on. If a hole, pit, or mark is missing from the many holes, pits or marks forming a image—such as a TV screen image—the essence of the image is not lost. However, while errors can be tolerated on optical systems storing only images, users of digital, or coded, data can tolerate very few errors.

It is thus apparent that there is a need in the art for an optical storage system that not only meets the data capacity and density needs of the exploding data processing industry, but that is also compatible with existing and future high performance CPU systems. Preferably, such an optical storage system will supplement (rather than replace) existing magnetic-based storage systems. That is, a few magnetic disk drives and a few optical disk drives coupled to a main CPU should be able to handle all the existing and future data storage needs of the large information user, instead of the roomsful of magnetic disk and tape drives that such a user must now have installed. Moreover, it is also apparent that there is a need in the art for an optical digital storage system that provides acceptable data bit error rates, preferably on the order of at least no more than one bit error for every 10E+12 bits of information. Also, the overall data access times must be compatible with the high speed, high performance computers that are presently available. The optical storage system herein disclosed, and in particular the error detection and correction features thereof, is directed to satisfying these and other needs.

SUMMARY OF THE INVENTION

It is an object of the present invention to provide an optical storage system that can be coupled to a host CPU via a storage director that may be shared with other peripheral devices, such as a magnetic disk drive.

It is a further object of the present invention to provide an optical storage system wherein relatively simple error detection and correction circuitry is used to ensure an acceptable bit error rate; and more particularly to provide such circuitry which may be shared by the encoding and decoding functions.

It is another object of the present invention to make the shared encode/decode circuitry self-checking, whereby errors that occur as the data is handled and processed within the shared circuitry are identified.

A further object of the invention is to provide error syndrome generation circuitry for use in one step of the ECC decoding process that provides buffering capabilities so that several operations involved with the entire ECC decoding process of several blocks of data may be performed simultaneously.

Still a further object of the invention is to provide a simplified ECC decoding process that is automatically invoked whenever certain prescribed conditions are present.

Another object of the present invention is to provide an optical storage system wherein all of the error detection and correction functions are carried out automatically by the optical system before data is passed back to a host CPU, thereby freeing up the valuable host CPU cycle times for other functions.

A further object of the invention is to provide an optical storage system that allows up to four gigabytes of user data to be permanently stored on a single removable disk for at least 10 years.

The above and other objects of the present invention are realized in an optical storage system that includes a removable platter or disk upon which the data is written, and a drive into which the platter is inserted when it is desired to read or write data. A storage controller that provides the necessary interface between a host CPU and the optical disk drive, advantageously allows other commercially available types of peripheral storage devices to be used with the CPU along with the optical storage system. The host CPU initiates the request to read or write data to the optical drive.

The disk media or "platter" upon which the data is stored is physically housed in a cartridge when the platter is not mounted within the drive. The entire cartridge is inserted into the drive by the user when it is desired to read or write data therefrom or thereto. The drive automatically removes the platter from the cartridge and mounts it for rotation on a suitable spindle mechanism. The cartridge advantageously protects the platter when not in use and allows for the easy storage thereof. This feature helps ensure the integrity of the data stored on the platter. A suitable platter identification number is optically written onto the platter, as well as onto the cartridge by other visible means.

The data format on the platter includes bands, tracks, blocks, and sectors. The platter surface is divided into a prescribed number of concentric areas that are referred to as "bands." Each band contains sufficient space wherein a prescribed number of concentric data tracks, each containing encoded user data, may be written. Data is organized on each track in fixed length logical units referred to as "blocks". In the preferred embodiment, there may be short blocks (e.g., 128 user bytes) and long blocks (e.g., 7904 user bytes). (As is known to those skilled in the art, a byte is a set number of data bits, typically 8.) Each track is physically divided into a fixed number of equal length segments referred to as "sectors". The sector is the smallest unit of encoded information. User data is encoded and written to specified types of sectors when stored on the platter. Other types of sectors are used to identify media defects and incompletely written user data.

In accordance with a main feature of the present invention, data bytes that are to be stored on the platter are appropriately encoded for error detection and correction purposes prior to writing the data on the platter. Thereafter, when the data is read back from the platter, this encoded data allows errors to be detected. Error correction circuitry is invoked to correct most of the detected errors. Decoding of the data also occurs. This encoding/decoding function is advantageously shared by the same circuitry. This greatly simplifies the complexity of the circuits needed within the optical drive.

As a further feature, the optical drive error correcting circuitry includes the capability of correcting raw error rates in the order of one error in 10E+5 bits to around one error in every 10E+13 bits. This error correction advantageously occurs before the decoded data is sent to the host computer. Consequently, correction of incorrectly received data need never be performed at the host level, thereby freeing up valuable host CPU cycle time for other functions.

In accordance with another feature of the invention, encoded error detection and correction information is grouped in special sectors that are strategically placed within the long and short blocks of data referred to above. The data in each block may then be handled as a unit for error correction purposes.

The optical drive includes means for automatically removing the platter from the cartridge and mounting the platter on a suitable spindle for rotation. Several servo systems provide the means for locating a specific area on the surface of the platter and for directing the appropriate read or write laser beams thereto. In order to provide the needed access time, the servo systems include a coarse and fine seek system whereby a given area of the platter may be reached quickly using the coarse seek function, such as locating a desired band, and thereafter the fine seek function may be used to locate a specific data track therein. Other servo systems provide the function of tracking a given data track, automatic focusing of the read and write laser beams, and spin control of the spin motor. A laser/optical unit includes three laser sources: a write laser which generates a beam that marks the platter surface; a read laser which generates a lower powered beam that reflects off the surface of the platter to detect marks recorded during a write operation and for subsequent read operations; and a coarse seek laser which senses carriage position error. (The carriage moves in and out radially with respect to the platter as controlled by the coarse servo system in order to locate a desired band on the surface of the platter.) The laser/optical unit also includes the mirrors, lenses, prisms, and other optical components that are needed for generating and directing the write and read laser beams to and from the desired locations.

A read/write channel is also included within the optical drive. The channel modulates and controls the write laser beam in response to data signals received from the host CPU through the storage director. The read/write channel also amplifies, filters, and converts to digital form, the information received from the read laser beam reflections. A clock signal is also derived from the read data. Control electronics provide the necessary interface with the storage controller, and provide the needed control signals for controlling the operations of the drive, including the handling and processing of data. The error detection and correction circuitry is also included within the control electronics.

Advantageously, the storage controller used to communicate with the optical drive to and from the host CPU may be any conventional controller for use with existing peripheral disk storage products, modified with appropriate software or code. No hardware changes are required.

In accordance with another feature of the optical storage system, the optical storage drive employs Dynamic Defect Skipping (DDS) to eliminate data errors that occur during a write operation. When a data error occurs while writing to the optical platter, it is immediately detected by using a read back check beam, and the data in the error is then rewritten. Consequently, all data written to the platter is correct. Appropriate tags or flags are used to identify incorrectly written data so that such data is subsequently ignored during a read operation.

In summary, the particular platter format used with the optical storage system herein disclosed, coupled with the protective cartridge in which the removable platter is housed, and the dynamic defect skipping and other error detecting and correcting features included within the optical disk drive, all combine to provide a versatile, accurate, efficient alternative and/or supplement to existing magnetically based data storage peripheral devices.

BRIEF DESCRIPTION OF THE DRAWINGS

The above and other objects, features, and advantages of the present invention will be more apparent from the following more particular description thereof presented in conjunction with the following drawings, wherein.

DESCRIPTION OF THE PREFERRED EMBODIMENT

The following description is of the best presently contemplated mode of carrying out the invention. This description is not to be taken in a limiting sense but is made merely for the purpose for describing the general principles of the invention. The scope of the invention should be determined with reference to the appended claims.

Figure 1:
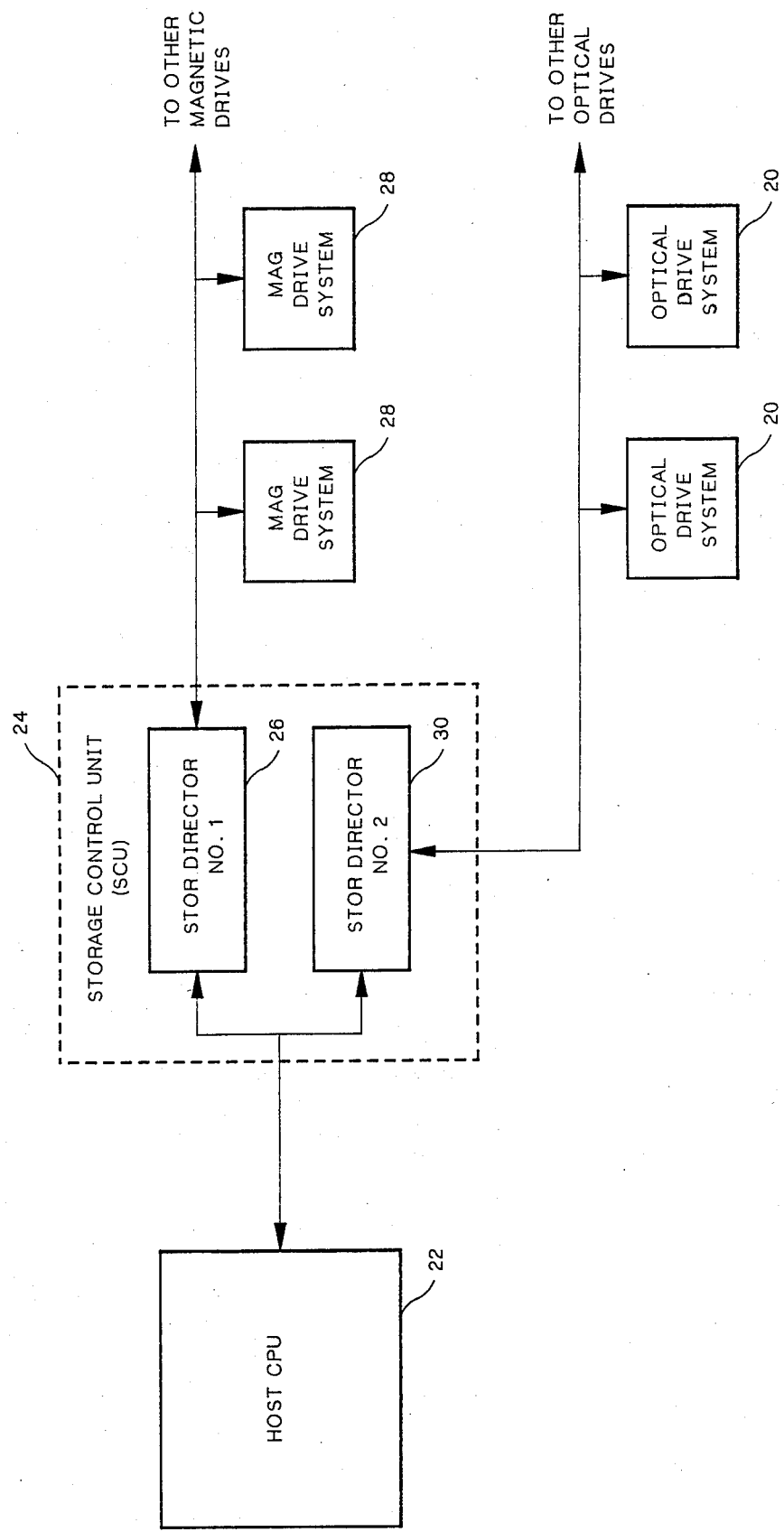
FIG. 1 is a block diagram illustrating how a plurality of optical drive systems may be coupled to a host CPU through a suitable control unit.

Referring to FIG. 1, an optical drive system 20 is adapted to be coupled to a host central processing unit (CPU) 22 via a storage control unit 24. Several optical drive systems 20 can be connected to the same control unit 24, if desired. Advantageously, in the preferred embodiment, the storage control unit 24 includes at least two storage directors. A first storage director 26 directs data to and from a plurality of magnetic drive systems 28. A second storage director 30 directs data to and from the optical drive systems 20. In this manner, both magnetic and optical storage devices may be coupled to the same host CPU 22 through the same storage control unit 24. This beneficial combination—of having both optical and magnetic storage devices coupled to the same host CPU through the same storage director—provides a great deal of flexibility to the user of large amounts of data.

Advantageously, neither the host CPU 22 nor the storage control unit 24 need have hardware modifications made thereto in order to properly interact with the optical drive system 20. Depending upon the operating system employed within the CPU 22, a suitable interface program (software) may be needed within the CPU in order to pass data to and from storage director 30. Similarly, appropriate software or firmware control within the storage control unit 24 may be used within the storage director 30 in order to provide the proper interface signals with the optical drive system 20. The implementation details associated with the resident CPU software and the control unit software or firmware are not important to the present invention. A representative data access method, implemented through the use of software resident within the CPU and storage control unit 24, is discussed in copending patent application Ser. No. 533,521 OPTICAL STORAGE SYSTEM, filed 09/19/83 which application is assigned to the same assignee as is this application.

In a preferred configuration, the storage control unit 24 may be a commercially available 8880 controller, manufactured by Storage Technology Corporation of Louisville, Colo. Such a control unit optionally provides either two or four storage directors. Therefore, a large number of disk storage peripheral devices, either optical or magnetic, can be coupled therethrough to a host CPU 22.

Figure 2:
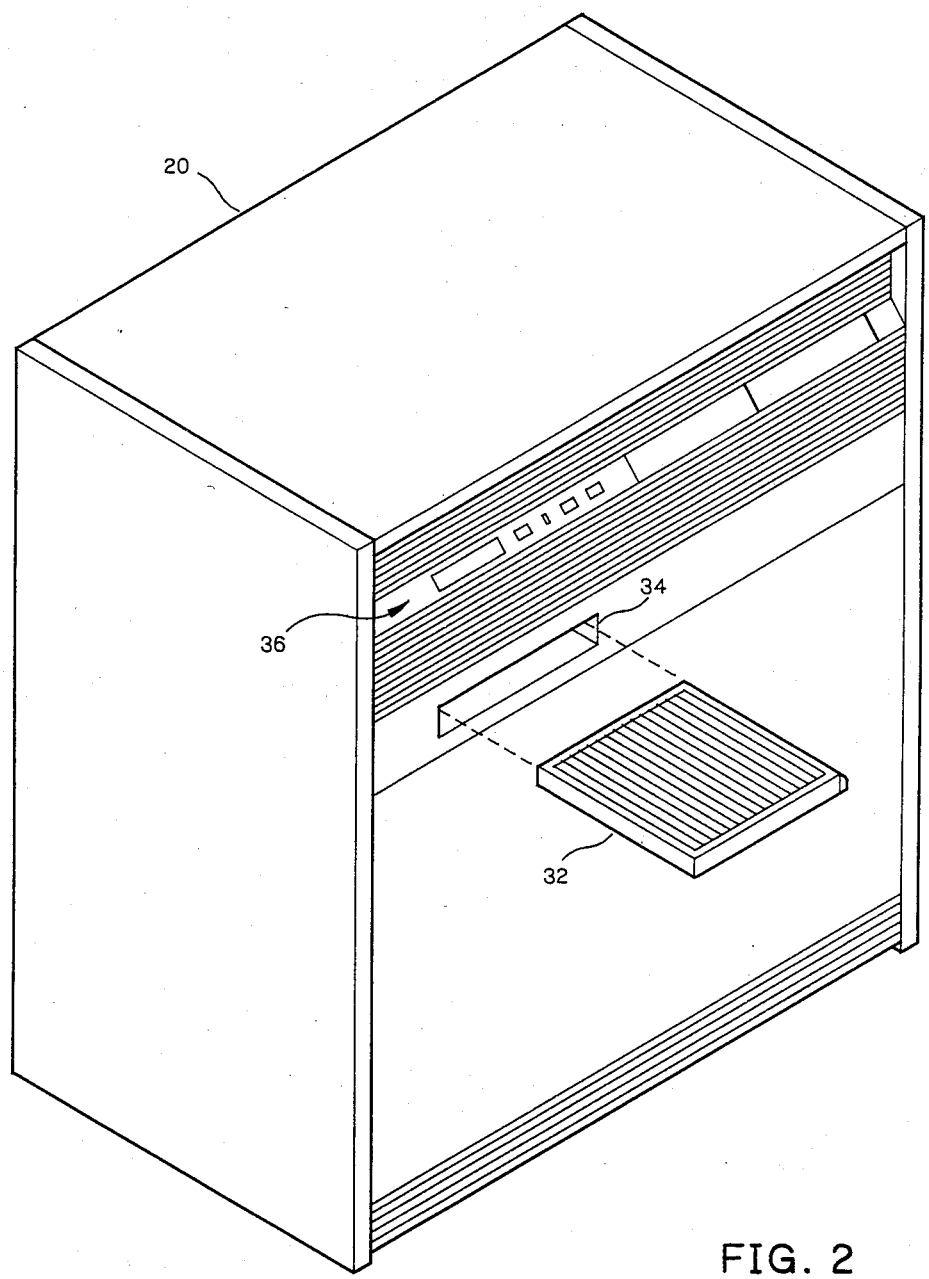
FIG. 2 is a perspective view of an optical drive system in accordance with the present invention, and shows how the platter cartridge is removably inserted thereinto.

Referring to FIG. 2, a perspective view of the optical drive system 20 of the present invention is shown. A cartridge 32, having the media therein upon which the data is optically stored, is adapted to be inserted into an opening or slot 34 along the front face of the drive system 20. Operator controls and indicators 36 are also conveniently located along the front of the unit 20.

Figure 3:
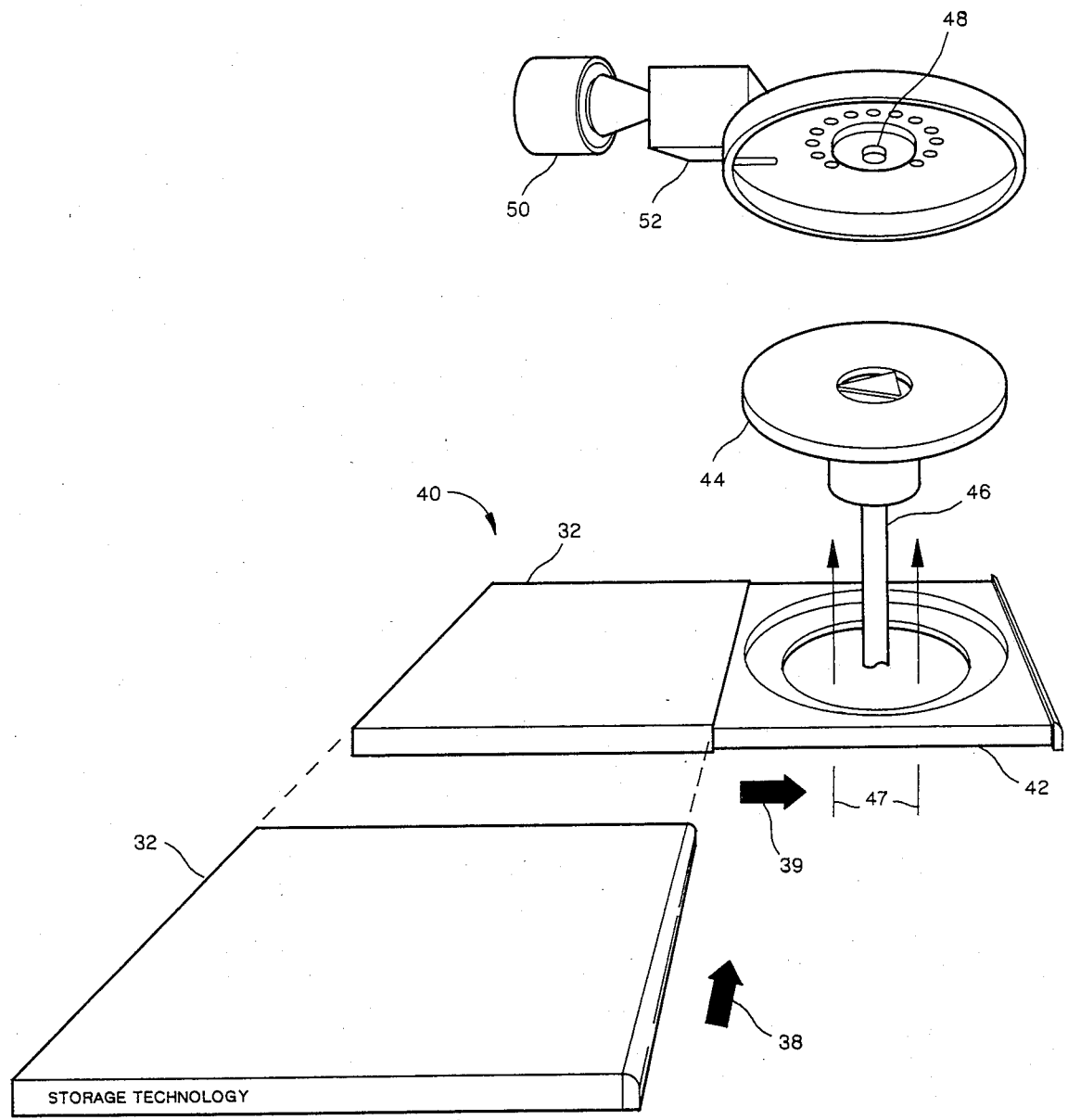
FIG. 3 is a mechanical schematic diagram illustrating how the platter is removed from the cartridge and mounted on a spindle of the optical drive system.

When a cartridge 32 is inserted into the drive 20, the media housed therein is removed from the cartridge as illustrated in FIG. 3. The cartridge 32 is pushed forward as indicated by the arrow 38 by the user. Once into the unit 20, at a position 40, the cartridge 32 is opened allowing a tray 42 holding the media or platter 44 to be slid out therefrom in the direction of the arrow 39. Once opened in this fashion, an elevator mechanism, schematically illustrated in FIG. 3 as a plunger 46, lifts the platter 44 away from the tray 42 in the direction indicated by the arrows 47. The platter 44 is the automatically centered and mounted on a spindle mechanism 48. An actuator 50 radially positions a read/write optical head 52 with respect to the mounted platter 44, thereby allowing optical access to a selected area on the surface of the platter. Further details associated with the elevator mechanism 46 and the cartridge 32 may be found in copending patent application Ser. Nos. 499,669, now abandoned, and 499,750, now U.S. Pat. No. 4,545,045 issued 1/1/85, both filed 5/31/83, assigned to the same assignee as is the present application. Additional details associated with the manner in which the platter 44 is centered on the spindle 48 may be found in copending patent application Ser. Nos. 481,963 now U.S. Pat. No. 4,502,136 issued 2/26/85 and 499,667, now U.S. Pat. No. 4,542,426 issued 9/17/85, filed 04/04/83 and 05/31/83, respectively, also assigned to the same assignee as is this application.

Figure 4:
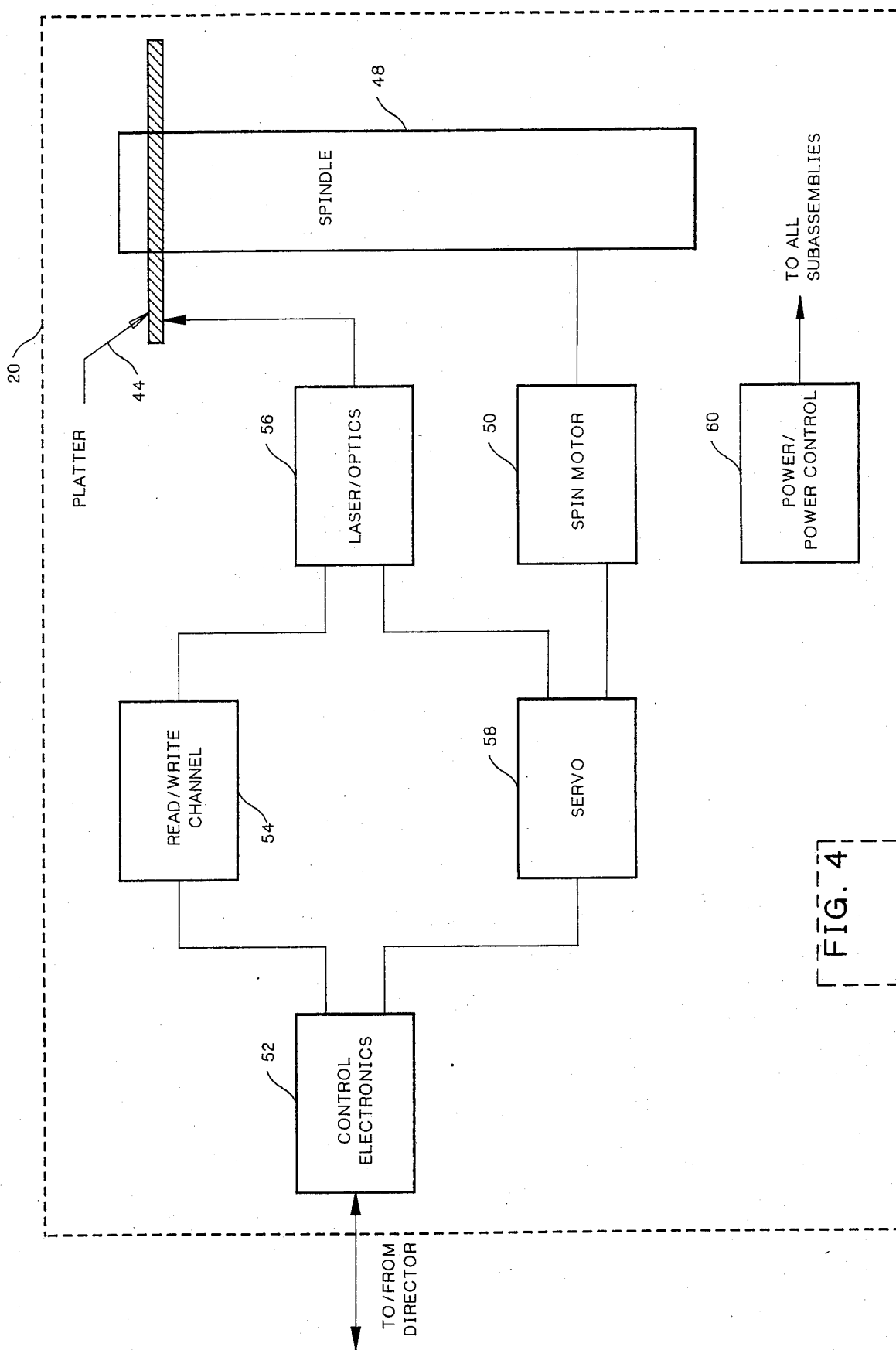
FIG. 4 is a block diagram of the optical drive system, and illustrates the principal elements used to read/write data from/to the platter.

Referring next to FIG. 4, a block diagram of the principle elements of the optical drive system 20 is shown. The platter 44 is mounted and centered on the spindle mechanism 48. A suitable spin motor 50 rotates the spindle 48, and hence the platter 44, at the desired rotational speed. Signals received from or sent to the storage director 30 (FIG. 1) pass through a control electronics section 52. The control electronics 52, as its name implies, provides the control necessary for communication with the storage control unit 24, including the interpretation of all commands received from the control unit 24. The control electronics 52 also provide the necessary signals for controlling all of the hardware operations associated with the optical drive system 20.

A read/write channel 54 modulates a write laser diode in response to data signals received from the control electronics 52. The resulting modulated laser beam is directed through a laser/optics section 56 to the surface of the platter 34. Servo control for the spin motor 50 and the moving elements associated with the laser/optics 56 is provided by a servo system 58. The servo system 58 actually includes several servo systems, including track seek and follow servo systems, optical focusing servos, spin motor servos, and the like. A power/power control assembly 60 provides the AC//DC power required for the operation of the optical drive system 20. Primary power is secured from a suitable 50 or 60 Hz 3 phase power source.

Figure 5:
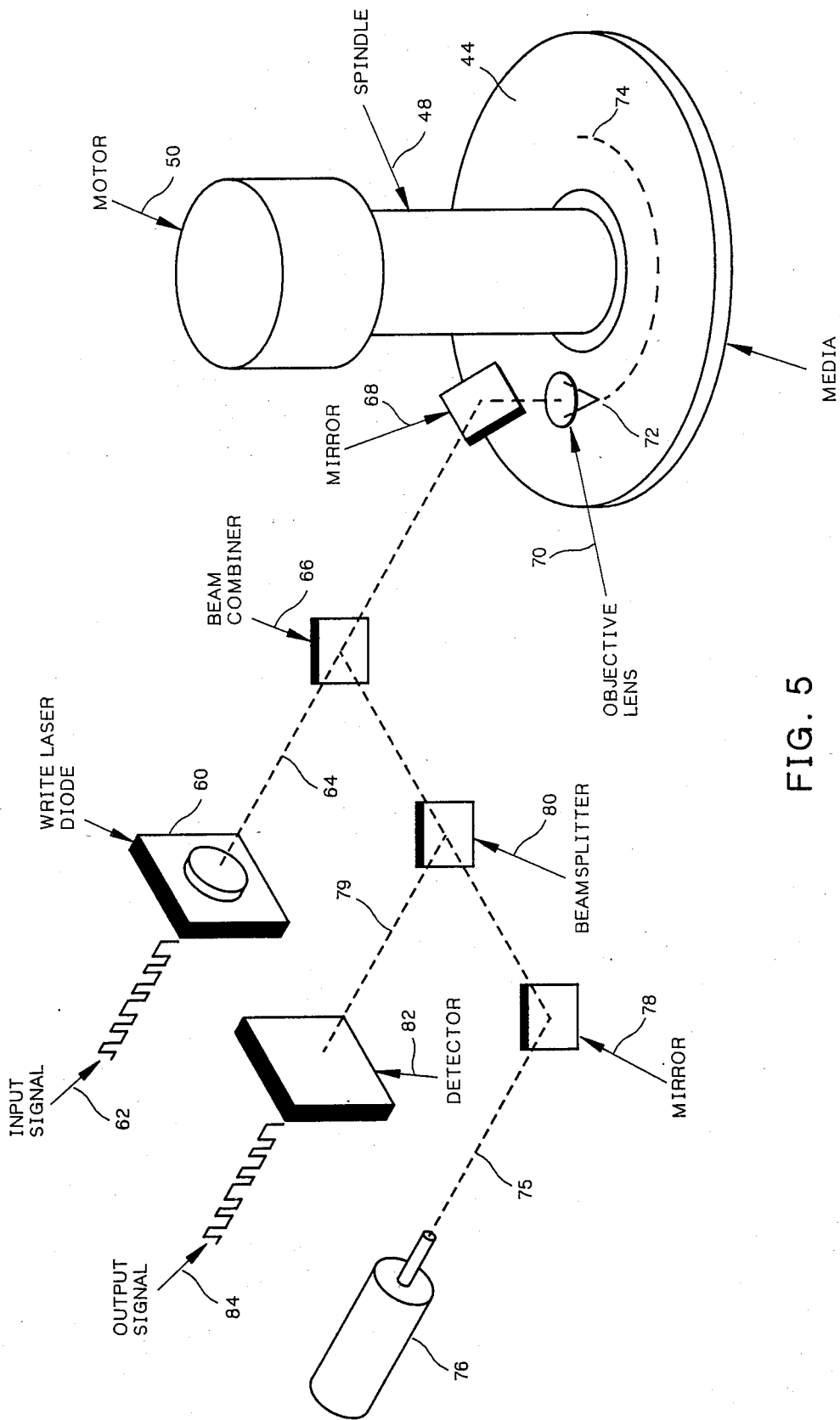
FIG. 5 is a simplified schematic depiction of the read/write process realized within the optical drive system.

In FIG. 5, a schematic representation of the read/write operation associated with the optical storage 20 is depicted. The platter 44, mounted and centered on the spindle mechanism 48, is spun by a spin motor 50. A write laser diode 60 is modulated by an input signal 62, which input signal represents the encoded binary digital data that is to be stored on the platter 44. A modulated laser beam 64, emitted from the write laser diode 60, is directed through a beam combiner 66, and is reflected from a suitable mirror or mirrors 68, through an objective lens 70 to a very small point 72 on the surface of the platter 44. Because the modulating signal is a binary (two level) signal, the modulated write beam is likewise a two level signal, having two power states associated therewith (typically "on" and "off" although high and low power states could likewise be used). The write laser beam 64 has sufficient power associated with its on or high power state to permanently mark the surface of the media 44 at the point 72. Because the platter 44 is spinning or rotating, a track of data 74 is thereby formed on the surface of the media or platter 44.

Conceptually, access to a desired track on the surface of the platter 44 is achieved by radially positioning the mirror 68 with respect to the platter 44 so as to provide coarse access to a desired band (several tracks) on the surface of the platter 44. The mirror 68 is then controllably tilted about a desired access point in order to direct the laser beam to a desired track within the accessed band. Further details associated with the preferred embodiment of this type of servo system may be found in copending patent application Ser. Nos. 438,133 and 503,955, now abandoned, filed 11/01/82 and 06/31/83, respectively, assigned to the same assignee as is this application.

During a read operation, a read laser beam 75 is generated from a suitable laser source 76. This beam 75 reflects off a mirror 78, passes through a beam splitter 80, reflects off the beam combiner 66, and reflects off the mirror 68 so as to pass through the objective lens 70 to the desired point 72 on the desired data track 74. This beam reflects off of the surface of the platter 44 and follows the same path back through the objective lens 70, the mirror 68, and the beam combiner 66 to the beam splitter 80. At the beam splitter 80, this reflected read beam 79 is directed to a suitable detector 82. The detector 82 generates an output signal 84 in response to the intensity of the reflected read signal 79, which reflected signal will vary in intensity according to the marks that have been placed on the media or platter 44 by the modulated write beam 64. In this manner, the binary input signal 62, stored as optically detectable marks on the surface of the platter 44 by the modulated write beam, may be subsequently retrieved therefrom. Advantageously, accelerated life tests indicate that data stored on the media or platter 44 will remain written thereon for as long as 10 years.

Figure 6A:
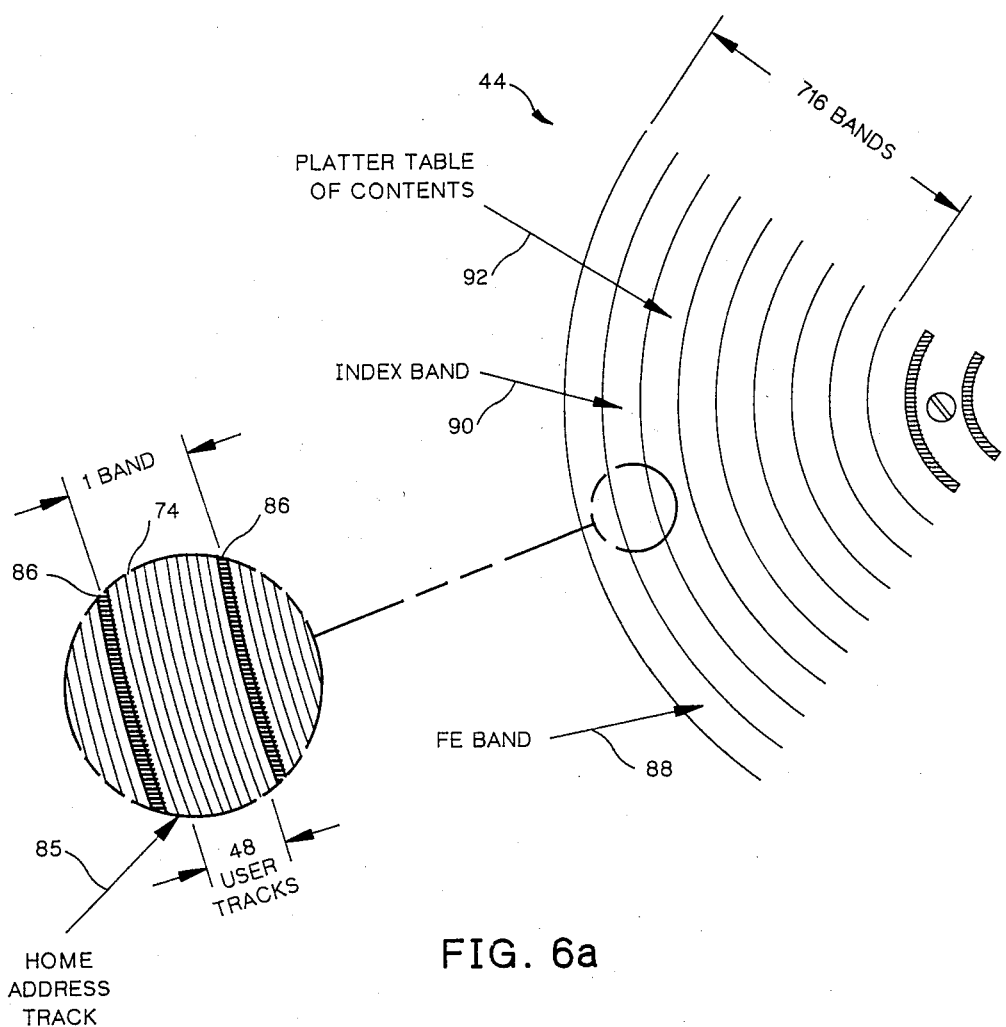
FIGS. 6a and 6b are representations of the data format and track organization, respectively, used on a platter in accordance with the present invention.

Referring next to FIG. 6a, a schematic representation of the format of the platter 44 is shown. The surface of the platter 44 is divided into a desired number of concentric bands, each band having a desired number of data tracks located therein. In the preferred embodiment, for example, up to 716 bands are included on each platter 44. Each band, as shown in the enlarged portion of FIG. 6a includes a desired number of data tracks. In the preferred embodiment, there are 49 data tracks in each band, one track 85 of which is designated as a home address track. The other 48 tracks are used to store desired data. The bands are physically separated by coarse servo tracks 86. These coarse servo tracks are used in conjunction with the servo system in order to position the optical read/write head 52 (FIG. 3) at the correct radial position of the platter 44. Advantageously, clock signals and sector boundary information may be embedded within the course servo tracks. The use of coarse servo tracks in this manner is fully described in the previously cited copending application, Ser. Nos. 438,133 and 503,955 now abandoned.

Figure 6B:
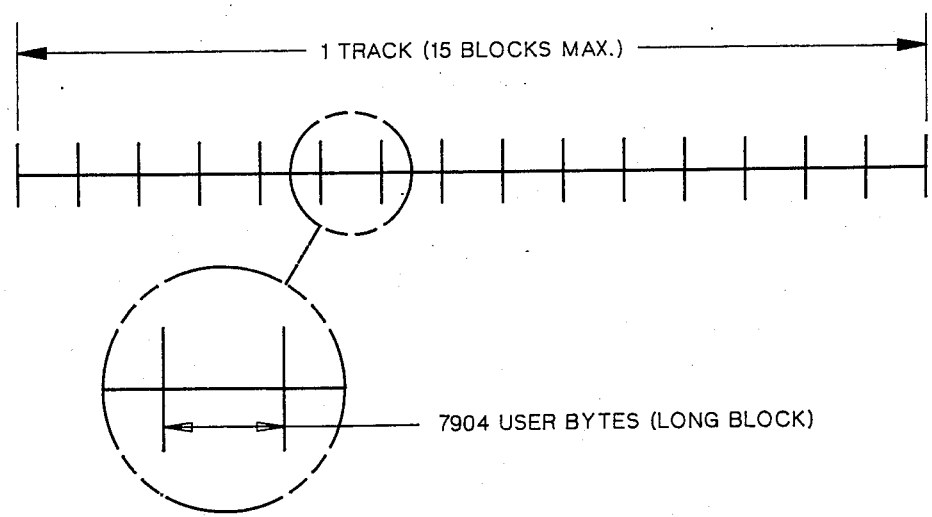

Data is organized on each track in fixed length logical units called blocks. One track may contain up to 15 blocks, as symbolically illustrated in FIG. 6b. A logical data block is a byte sequence whose length is either 136 bytes (a short block) or 7912 bytes (a long block). Short blocks are used primarily for housekeeping functions, and as such are generally be found in an Index Band 90. Long blocks are used for reading and writing user data, and are also used in the FE bank 98 and the PTOC (Platter Table of Contents) band 92. The maximum number of short blocks for a track is 222, and the maximum number of long blocks per track is 15. As will be explained hereinafter, the actual number of blocks per track may vary due to the number of defects encountered on the platter surface. Eight of the bytes contained within a short or long block are reserved as identification bytes. The remaining bytes are available for user data. Thus, there are 7904 user bytes in a long block, as indicated in FIG. 6b.

Each track is physically divided into a fixed number of equal length segments referred to as "sectors." The sector is the smallest unit of encoded information, and its boundaries are predefined by sector pulses or marks. User data is encoded and defined into various types of sectors in order to be written to the platter 44. Other types of sectors, as explained below, are used to identify media or platter defects and incompletely written user data.

When the encoded data is written on the platter, a read back check is employed in order to verify that the data has been correctly written. If a data error is detected, the sector is rewritten in such a way that during a normal read operation, the bad sector (the one containing the incorrect data) can be identified and ignored.

In order to properly identify defective sectors, an additional sequence of sectors are thus appended to every logical data block prior to having it written on the platter. These additional sequence of sectors may be thought of as subsystem overhead sectors. The combination of the logical data block (the user data) and the subsystem overhead sectors is referred to as a physical data block. The total number of sectors which comprise a physical data block may vary due to the number of media defects encountered while writing the block of data to the platter.

Figure 7:
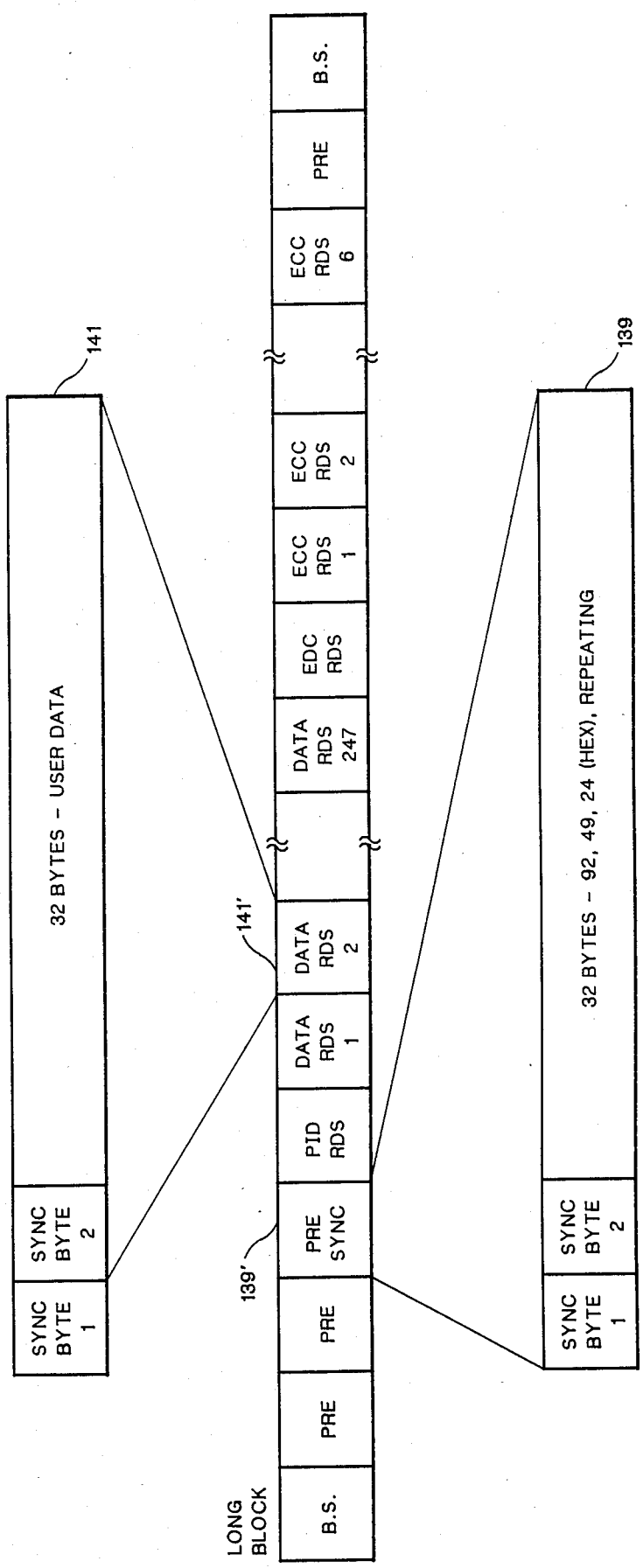
FIG. 7 is a diagram of the format used within a long block of data.

In the absence of detected errors, the physical data blocks recorded on a given track have a format as depicted in FIG. 7. This format may be described as a sequence of sectors in the following order:

1. A block separator sector.
2. Two preamble sectors.
3. One preamble/Resynchronizable Data Sector (Pre/Resync sector).
4. One sector containing a physical identifier or Physical I.D. (PID). The PID is an 8-byte number supplied by the control electronics 52 (FIG. 2) whenever data is written to the platter. This 8-byte number indicates the band number, track number, and relative record number within a band.
5. Two hundred forty seven (long block) or four (short block) Resynchronizable Data Sectors containing 7904 (long block) or 128 (short block) bytes of user data. This user data may include a logical ID (LID) and a KEY as well as the user data. The LID is a 8-byte logical ID supplied by the access method of the host CPU 22. As such, the LID is a part of the user record and can be used as an address, and its use is a user option. The KEY is a string of data of up to 64 bytes that is appended to user data, if desired, by the host access method. As such, the KEY is also a part of the user record and can be used for addressing purposes if desired. LID's and KEY's are thus optional identifiers that may be used to further identify and locate a particular block of user data.
6. An error detection code resynchronizable data sector (34 bytes).
7. Six resynchronizable data sectors containing the error correction code for the data (204 bytes).
8. A Pre/Resync sector.
9. A block separator sector.

From the above list, it is seen that a long block format (in the absence of detected errors) contains 261 total sectors, while a short block contains 18 total sectors. The sectors identified in items 3-8 above are all resynchronizable, each beginning with two sync bytes as described hereinafter.

Subsequent blocks are written beginning in the sector immediately following the last block separator of the previously written data block.

In the preferred embodiment, the block separator sector has a 1.6 MHz square wave written therein. A preamble sector, in contrast, has an 8 MHz square wave written therein. As indicated in FIG. 7, the preamble/resynchronizable data sector comprises two SYNC BYTES followed by an 8 MHz square wave. (Advantageously, the 8 MHz square wave can be generated by the 2-7 encoding of 92, 49, 24 [hex] repeating data.)

The physical identifier, or PID sector shown in FIG. 7, is comprised of two SYNC BYTES followed by 32 bytes of 2-7 encoded data comprising two identical copies of a 16 byte groups of data (hex) as follows:

FF
FF
FF
One's complement Track Number.
One's complement Band High.
One's complement Band Low.
One's complement Relative Block High.
One's complement Relative Block Low.
00
00
00
Track Number.
Band high.
Band low.
Relative Block High.
Relative Block Low.

As those skilled in the art will recognize, "FF and 00" are respectively the highest and lowest hex numbers. Tracks are numbered consecutively from the outermost track of the band to the inner most track of a band. The bands are likewise numbered beginning from the outermost band to the innermost band on the platter. Similarly, the blocks of data within a given track are consecutively numbered. By including within the PID sector both the one's complement and the number itself of the track, band, and block, a positive identification can therefore be made.

As further indicated in FIG. 7, the Resynchronizable Data Sectors comprise two SYNC BYTES followed by 32 bytes of encoded user data.

The Error Detection Code Resynchronizable Data Sector (EDC RDS) includes two SYNC BYTES followed by two bytes of 2-7 encoded data whose value is determined by a CRC combination of selected data sectors. For a short block, the CRC polynomial is $x^{16}+x^{15}+x^2+x+1$. The seed (initialization) pattern is "5D5D". Thirty bytes of 00 follow the EDC bytes to fill the resynchronizable data sector.

The error correction data, or error correction code (ECC), comprises two SYNC BYTES followed by 32 bytes of 2-7 encoded data whose value is determined by an interleaved REED SOLOMON computation on the selected data sectors and on the EDC resynchronizable data sector. The theory and implementation of the ECC that is used is discussed in more detail below.

With the data stored on the platter formatted as described above, each block of data can be readily identified. Moreover, many of the sectors used within each block of data are resynchronizable. That is, they begin with two SYNC BYTES. Hence, a data detection scheme can lock on to these SYNC BYTES using phase lock techniques in order to ensure that the subsequent data is accurately detected. (Conventional phase lock and detection schemes may be used.) Advantageously, the two SYNC BYTES that precede every resynchronizable sector do not map into any user data, yet the 2-7 code constraints are maintained. The 2-7 code is so named because the encoded data has the characteristic that a "1" is separated by a minimum of two 0's and a maximum of seven 0's. The 2-7 code may be summarized as shown in Table 1.

TABLE 1

| 2-7 CODE | |
|---|---|
| DATA WORD | CODE WORD |
| 10 | 0100 |
| 010 | 100100 |
| 0010 | 00100100 |

TABLE 1-continued

| 2-7 CODE | |
|---|---|
| DATA WORD | CODE WORD |
| 11 | 1000 |
| 011 | 001000 |
| 0011 | 00001000 |
| 000 | 000100 |

The SYNC BYTES within each resynchronizable sector are used to establish a known bit position in the data stream. This position is required to allow the 2-7 decoding to begin at a code boundary in the bit stream and to determine the byte boundaries of the decoded data. The SYNC BYTES are located in the first two byte positions of the resynchronizable sectors as shown in FIG. 7. These resynchronizable sectors include the Pre/Resnc, the PID, data, EDC, and ECC sectors of each data block. Further details associated with the generation and detection of these sync bytes may be found in copending patent application SYNC PATTERN ENCODING SYSTEM FOR DATA SECTORS WRITTEN ON A STORAGE MEDIUM, Ser. No. 533,826, now abandoned, filed concurrently herewith.

Figure 8:
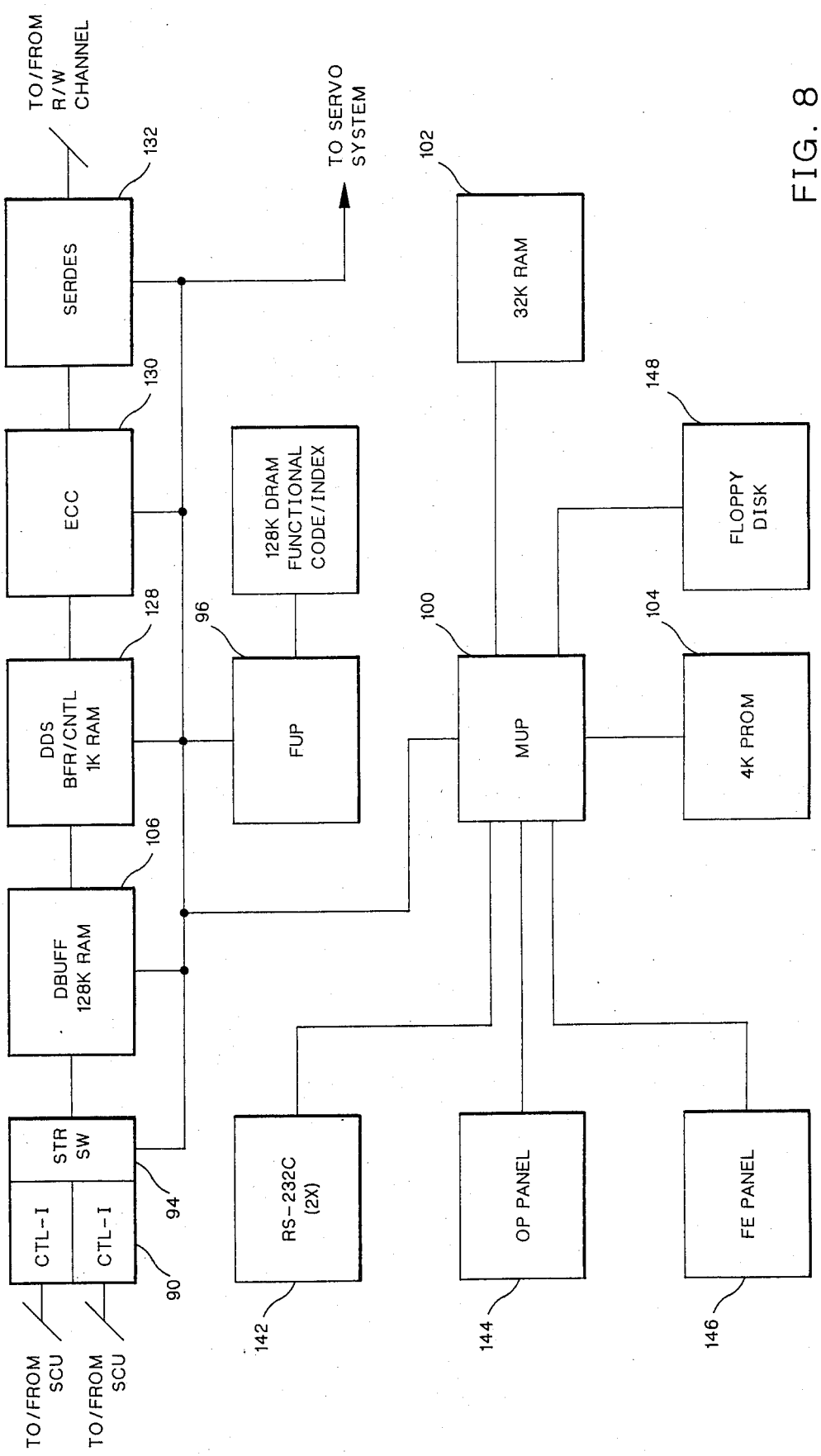
FIG. 8 is a block diagram of the control electronics of FIG. 4.

Referring next to FIG. 8, there is shown a block diagram of the control electronics 52 (FIG. 4) of the optical drive system 20. In the preferred embodiment, two control interfaces 90 and 92 are provided to enable communications with two separate storage directors of the storage control unit 24 (FIG. 1). Communication with two separate directors is provided to add flexibility to the particular configuration that will be used with the optical drive systems. A suitable switch 94 allows communication with either director to be selected.

A functional microprocessor 96 (FUP) performs the following functions within the optical drive system:
1. Hardware control.
2. Interpretation/execution of commands from the selected storage director.
3. Index buffer management.
4. Rapid band search (RBS).
5. Interrupt handling.
6. Status reporting.

Advantageously, this functional microprocessor 96 may be realized with a commercially available 16-bit processor chip, such as the MD 68000 manufactured by Motorola Semiconductor of Phoenix, Ariz.

Code for the microprocessor 96 may be stored in a suitable memory device 98, such as a 128K Dynamic Random-Access-Memory (DRAM). The DRAM 98 may also provide additional memory associated with the operation of the control electronics, such as index and other information.

A maintenance microprocessor (MUP) 100 is also used to provide the functions necessary for communications with and testing of the optical drive system 20. A 32K random access memory (RAM) 102 provides the necessary storage for the code associated with the maintenance microprocessor 100. Advantageously, the maintenance processor 100 may be realized with an identical chip as is the functional microprocessor 96. A 4K read only memory (ROM), such as a programmable ROM (PROM) 104, is used to provide the Boot and start-up code for the MUP 100 and the other start-up functions associated with the control electronics 52.

A Data Buffer (DBUF) provides temporary storage of data transferred for read/write operations and compensates for the different access rates associated with the optical drive system. Thus, it is used for matching the speed of data transfer with the transfer rate of the host CPU 22. In the preferred embodiment, the DBUF 106 has a data capacity of one track, or 128K bytes.

Still referring to FIG. 8, a Dynamic Defect Skipping (DDS) buffer and control block 128 provides the necessary buffering for rewriting data after detected defects and to control read transmitted data during read. The Dynamic Defect Skip function is described more fully in copending patent application OPTICALLY STORING DIGITAL DATA, Ser. No. 533,907, now abandoned, assigned to the same assignee as is the present application, and filed concurrently herewith.

Suitable error correction code (ECC) circuitry 130 is employed in the data path to improve the data error rate during a read operation. As with all ECC schemes, this process involves properly encoding the data when it is written with a suitable code that when read back not only helps identify that an error has occurred but also provides the necessary information to correct the error in most cases. In the preferred embodiment, the error correction code that is used comprises a triple error correcting (255, 249) REED/SOLOMON code, interleaved to degree 32. Each of the 32 interleaves has 6 ECC bytes associated therewith for a total of 192 ECC bytes for each block of data. The location of the ECC bytes within the block is as shown in FIG. 7. Advantageously, the code is capable of correcting three symbols (bytes) in error per interleave. Because of this interleaving, this yields a first correction capability of 96 bytes. The error of the code is designed to meet or exceed the criteria that no more than one uncorrectable error occur in 10E+13 bits transferred.

The circuitry used to encode and decode the error correction code is advantageously shared between the encoding and decoding processes. This feature is discussed in more detail below.

Figure 9:
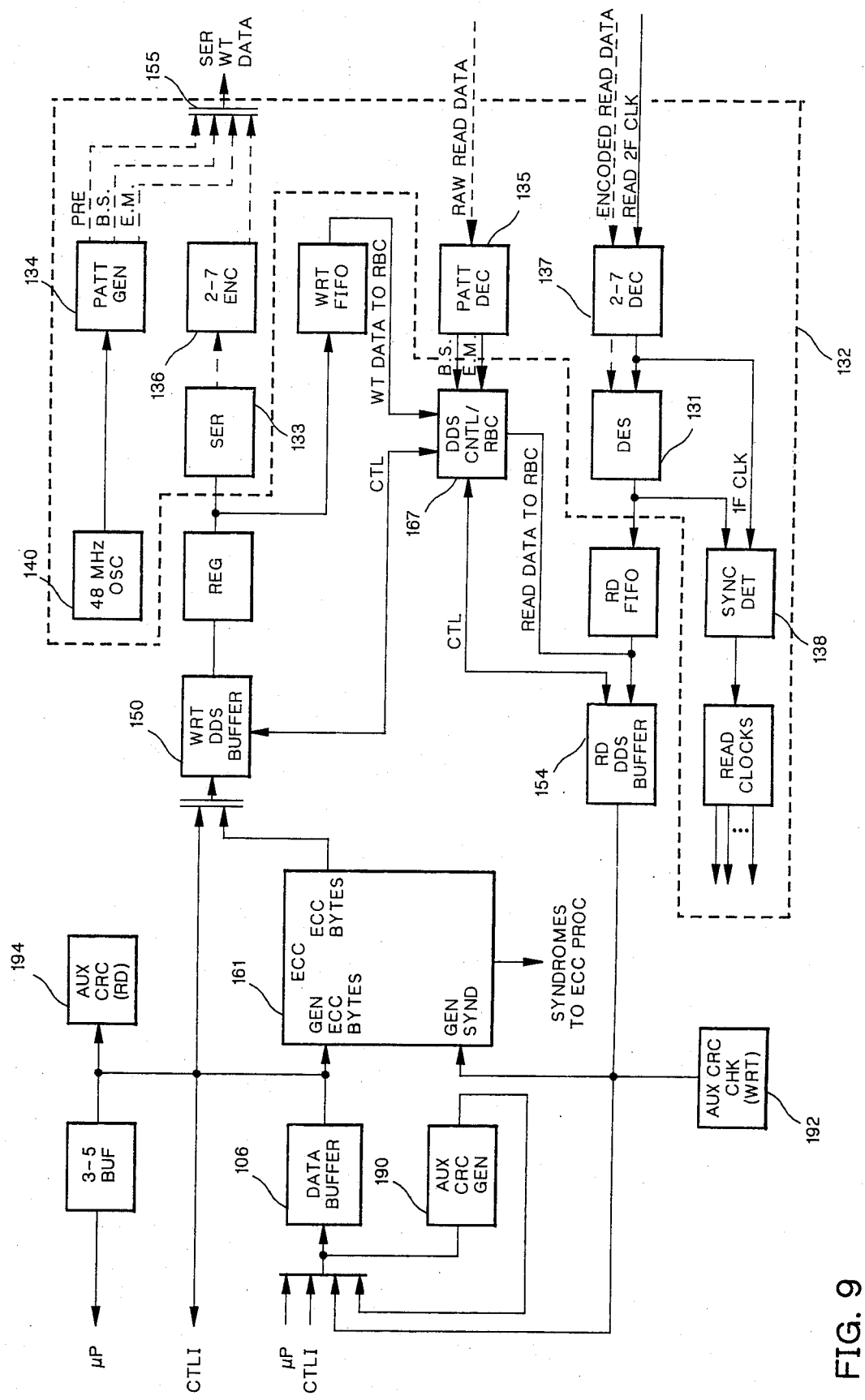
FIG. 9 is a block diagram illustrating the principle elements associated with the data path of the control electronics of FIG. 4.

Referring still to FIG. 8, a serializer/deserializer (SERDES) circuit 132 is used to take byte-serial channel data and convert it into bit-serial data to be written on the platter and vice-versa. The SERDES 132 circuitry comprises the elements enclosed within dotted line 132 of FIG. 9, which figure depicts the data path associated with the control electronics 52 (FIG. 4). As is evident from an examination of FIG. 9, the SERDES circuitry provides the desired encode/decode function. The translation from data to code words and back follows the pattern indicated in Table 1. The decode function performed at block 137 (FIG. 11), takes as inputs a 2F clock signal (which may be obtained from the coarse servo tracks as described in copending patent application Ser. No. 501,956, filed 06/07/83, now abandoned, assigned to the same assignee as is this application, which application is incorporated herein by reference) and the detected data from the phase locked loop circuits and generates corresponding data bits. The decode function of the decoder 137 also provides error checking to detect the presence of "11" "101", or "00000000" patterns in the coded data. These bit patterns violate the rules for a 2-7 code.

There are a number of special patterns that are inserted into the serial encoded bit-stream for formatting and for defect skipping purposes. These patterns include block separators, exception marks, and special resync characters. Thus, pattern generation circuitry 134 (FIG. 9) provides these characters to the data stream at the output of the 2-7 encoder 136.

A synchronizer circuit 138 provides the means to detect the beginning of a Resynchronizable Data Section (RDS) by decoding the special 2-byte field at the start of every RDS. (An RDS is that sequence of data bytes, such as is shown at 139 and 141 of FIG. 7 that is written into a data sector, such as 139′ or 141′ of a block of data). The circuit 138 also provides the means to acquire phase-sync for the 2-7 decoder and bit-sync for the data path.

In the preferred embodiment, the 2F frequency used in the generation of encoded data is derived from a crystal oscillator 140 running at 48 MHz. Other clocks used in the data path are all derived from this frequency. The clocks are distributed throughout the control electronics 52 (FIG. 4) as a 1F clock signal (24 MHz) and as four 12 MHz clock signals, each derived from the 1F clock and offset from each other by 90°.

Referring back to FIG. 8, an RS-232 interface 142 is provided within the control electronics in order to allow communication with the optical drive system 20 through the use of any suitable diagnostic tool on either a local or remote basis. An operator panel 144 provides the controls and indicators necessary for operator use in completing a power up/down sequence, or in a load-/unload of a cartridge 32. An FE panel 146 provides to the field engineer a manner of controlling and monitoring the operation of the optical drive system 20 so that proper diagnostics and tests can be run. A floppy disk 148, preferably an 8-inch floppy disk, provides storage for the maintenance processor 100 microcode, diagnostic microcode, and error log information.

Figure 10:
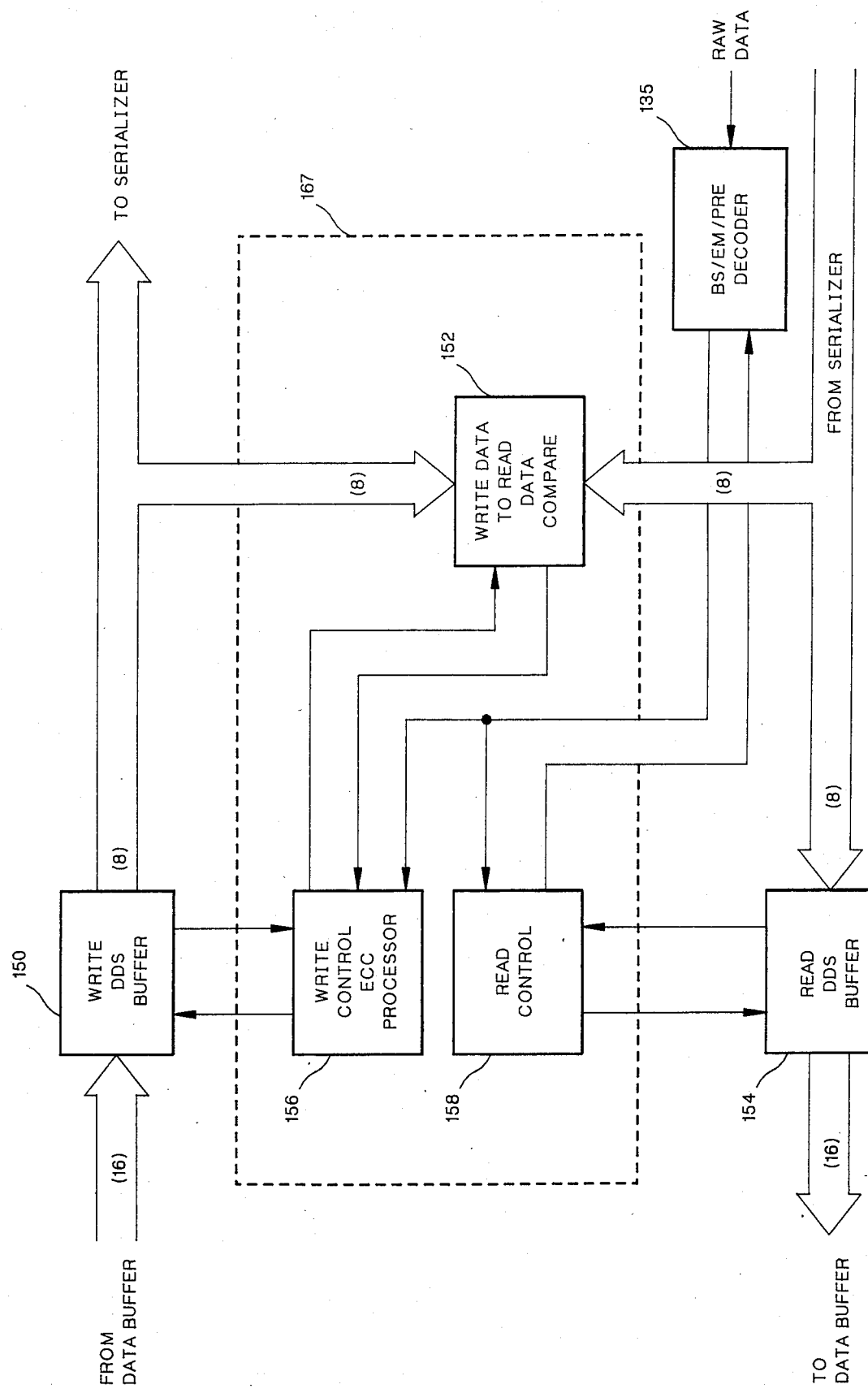
FIG. 10 is a block diagram illustrating the principal elements used to realize the dynamic defect skipping function.

As mentioned previously, an important feature of the optical storage system described herein is the ability to correctly write data on the platter during a write operation. Correctness on the data is assured by performing a read back check. That is, immediately after the data is written on the platter 44 it is read back therefrom. The data read back is compared with the data written to the platter and if any differences exist then the data has been incorrectly written and is so marked. This process is repeated as many times as is necessary (within reason) in order to ensure the correctness of the written data. This process is referred to as Dynamic Defect Skipping (DDS) and is functionally illustrated in FIG. 10. The data to be written is loaded into a write buffer 150. From this buffer 150, the write data is made available to the serializer 133 and a comparator circuit 152. Data read from the platter immediately after it is written is likewise made available to the comparator circuit 152 and to a read buffer 154. If the compare function performed by the comparator circuit 152 indicates that the data read back is the same as the data written to the platter, then appropriate control signals are generated to allow the read data held in the read buffer 154 to be transferred to the data buffer 106. If, however, the comparison of the write data to the read data indicates that an error has occurred, then appropriate control signals are generated to flag that particular sector as containing incorrect information. Any subsequent attempts to read a sector so flagged will cause the data therein to be ignored (not made available to the data buffer).

The particular flag used to indicate whether a given data sector is good or not is referred to as an Exception Mark (EM). An Exception Mark is a 2.0 MHz square wave signal and is derived from the 48 MHz write clock, as are the preamble signal (an 8 MHz square wave) and the block separator (BS) signal (a 1.5 MHz square wave). As indicated previously (in FIG. 7) each block of data starts with a block separator sector followed by two preamble sectors. (A block separator sector is a sector having a block separator signal written therein. Similarly, a preamble sector is a sector having a preamble signal written therein. Thus, as a short hand notation, a sector is identified by the signal written therein, e.g., an exception mark or EM sector, an RDS sector, a BS sector, etc.) The phase lock loop circuits used to detect the data require that at least two sectors of preamble precede the data. If any sector in these initial three sectors—the block separator or two preamble sectors—is bad, then the sequence must be restarted. A defective data sector is marked by a preamble/exception mark sequence. That is, immediately following the detection of a defective data sector, the following sectors are written:

Preamble sector
Exception mark sector
Preamble sector
Preamble sector
Pre/Resync sector
Rewrite of sector before defective sector
Rewrite of defective sector As mentioned previously, the present invention employs a triple error correcting (255,249) Reed-Solomon code, interleaved to degree 32. The advantages of using Reed-Solomon and similar codes are known in the art. See, e.g., Berlekamp, E. R., "Bit-Serial Reed-Solomon Encoders", IEEE Transactions on Information Theory, Vol. IT-28, No. 6, November 1982, pp. 869–74; Perlman, M. and Lee, Jun-Ji; "Reed-Solomon Encoders—Conventional vs Berlekamp's Architecture" Jet Propulsion Laboratory, JPL Publication 82-71 (NASA), Dec. 1, 1982; Clark and Cain, *Error Correction Coding For Digital Communication* (Plenum Press, N.Y. 1981).

The IEEE Berlekamp paper and the Perlman and Lee JPL Publication are incorporated by reference herein. Pages 79–84 of the Clark and Cain book are also incorporated herein by reference.

Basically, the successful use of an error correction system involves two main steps: (1) generating a suitable code word and combining it with the data (encoding process), and (2) generating a suitable syndrome that can be used to detect and correct errors that may have occurred in the encoded data, as well as to perform the necessary decoding of the encoded data (decoding process). In order to better appreciate these two steps, some theoretical background information will now be given.

A Reed-Solomon code is essentially a cyclic code having a sequence of characters that may be expressed as the coefficients of a polynomial $$C(x) = \sum_{i=0}^{n-1} C_i X^i \qquad (1)$$

For Reed-Solomon codes, the characters $C_{n-1} \ldots C_o$ are elements of a Galois field $GF(2^m)$, where m is an integer. A sequence of n characters is the code word if and only if its corresponding polynominal $C(x)$ is a multiple of the code's generator polynominal, $g(x)$. The method of encoding a Reed-Solomon code is to regard $C_{n-1} \ldots C_{n-k}$ as message characters and to divide the polynominal $$D(x) = \sum_{i=n-k}^{n-1} C_i X^i \qquad (2)$$

by $g(x)$. This division results in a quotient $Q(x)$ and a remainder $R(x)$. (The degree of $R(x)$ will be less than the degree of $g(x)$.)

Check digits, $C_o \ldots C_{m-k-1}$ are defined as the negatives of the coefficients of the remainder $R(x)$. Hence $$C(x) = \sum_{i=n-k}^{n-1} C_i X^i + \sum_{i=0}^{n-k-1} C_i X^i \qquad (3)$$

$$= g(x) \times Q(x) + R(x) + \sum_{i=0}^{n-l-1} C_i X^i$$

$$= g(x) \times Q(x)$$

This ensures that the polynominal $C(x)$ is a multiple of $g(x)$, as required by the code decoding rules.

The encoding process comprises generating a Reed-Solomon code using a generator polynominal of the type $$g(x) = \prod_{i=0}^{d-2} (x - \alpha^i) \qquad (4)$$

where d is the designed distance of the code, and $\alpha$ is a primitive GF element. The decoding process comprises computing syndromes $S_i(x)$ for $i = 0 - d$ such that $$S_i(x) = C(x) \bmod (x - \alpha^i) \qquad (5)$$

These syndromes, once computed, provide the basis for detecting and correcting errors.

As mentioned previously, error correction involves two main processes: (1) encoding, and (2) decoding. To be more specific, during the encoding process the remainder polynominal $R(x)$ must be computed. This polynominal defines the check symbols that are appended to the data before it is written (stored) on the platter. When the data is read from the platter, it must be decoded. The decoding process, for error correction purposes, involves 4 main steps. These decoding steps are (1) generating the syndrome polynominal $S_i(x)$;
(2) using $S_i(x)$ to compute the coefficients if an Error Location Polynominal (E.L.P.);
(3) solving the E.L.P. to find the location of the errors; and
(4) correcting the errors at the identified location.

The present invention is directed to sharing the same circuitry for computing the remainder polynominal $R(x)$—the encoding function—and generating the syndrome polynominal $S_i(x)$—item (1) above of the decoding function. This "shared" approach greatly simplifies the complex circuitry that would otherwise be required, thereby allowing the error correction function to be completed within the optical drive's control electronics. The remaining ECC decoding steps, steps (2)–(4) above, may then be efficiently performed using conventional techniques known by those skilled in the art.

In FIG. 8, which is a block diagram of the control electronics of the optical drive system 20 (FIG. 1), the ECC function is represented as a single block or element 130. Actually, the element 130 comprises two main components: (1) the "shared" ECC encoder/decoder circuitry of the present invention (shown as element 161 in FIG. 9); and (2) an ECC Processor. The ECC Processor is not shown as a separate element in FIG. 9, but in the preferred embodiment it is included as, i.e., the processor function is shared with, one of the processors contained within the DDS Control Circuitry 167. More particularly, the ECC processing function is carried out by the processor contained within the write control element 167 of FIG. 10.

Figure 11:
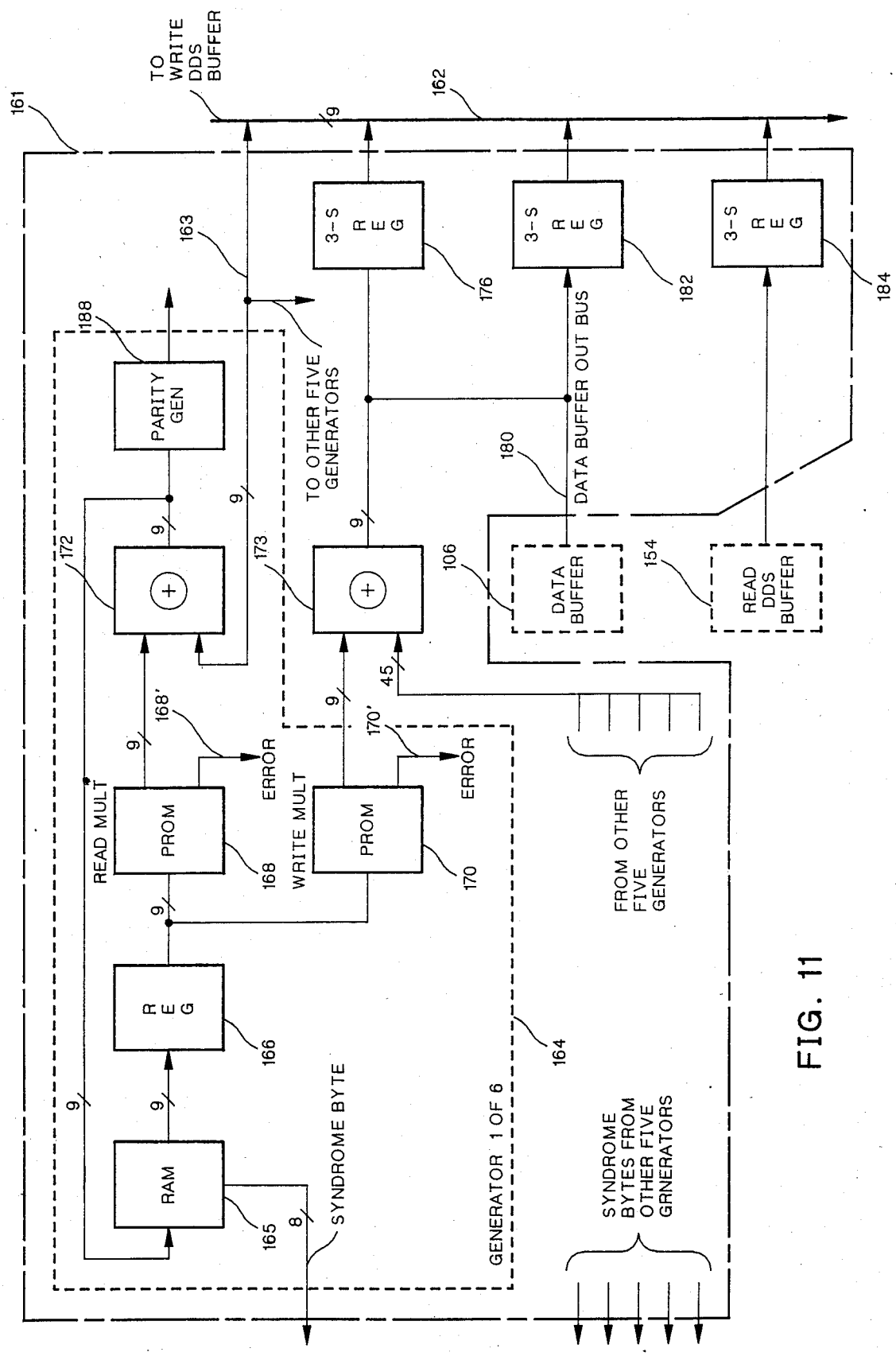
FIG. 11 is a block diagram of the shared encoder/decoder circuit of the present invention.

The principal elements of the "shared" ECC encoding/decoding circuitry 161 are shown in FIG. 11. Because in the preferred embodiment each interleave has six ECC bytes associated therewith, there are six ECC generation circuits 164. Only one of these six generators is depicted in FIG. 11, because the circuitry is the same. The only difference therebetween is that the Read and Write Multipliers 168 and 170 perform different operations (use a different multiplicand) in each of the six generation circuits. (Note, the number of such generator circuits that is needed is determined by the distance of the code.)

The ECC generator 164 includes four main elements. An Exclusive-Or circuit 172 performs the modulo two addition of the input data byte on the input bus 163 and product data byte obtained from a Read Multiplier 168. An input multiplicand to the Read Multiplier 168 is obtained from a RAM 165. The RAM 165 receives the data byte (code word) passed to the Read Multiplier 168 from a modulo two addition performed by the Exclusive-Or circuit 172. Thus, a loop is created whereby a given byte held in the RAM is repeatedly circulated and processed by the multiplication operation performed by the read multiplier 168 and the modulo two addition operation performed by the Exclusive Or circuit 172.

Also coupled to the output of the RAM 165 is a Write Multiplier circuit 170. The Write Multiplier 170 performs a desired operation on the data byte being processed through the loop, and presents the resulting product to a second Exclusive Or circuit 173. The Exclusive Or circuit 173 combines this product byte obtained from the write multiplier 170 with similar product bytes obtained from the other five generator circuits. The resulting sum from the Exclusive Or circuit 173 is selectively coupled back to the main data bus 162 through a tri-state buffer 176.

Figure 12:
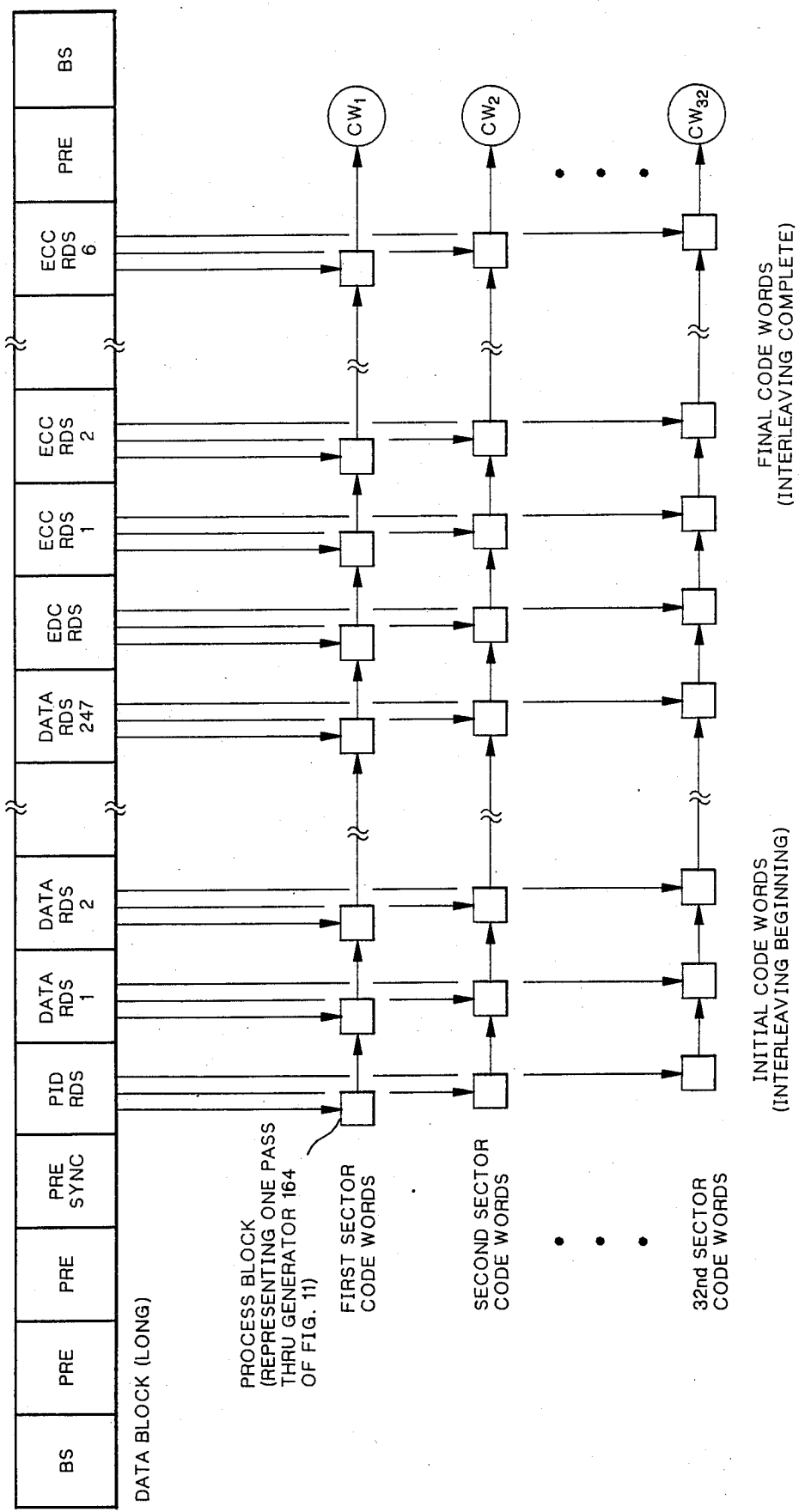
FIG. 12 is a data processing flow diagram illustrating the interleaving process that occurs using the generator of FIG. 11.

As indicated previously, in the preferred embodiment a Reed-Solomon code interleaved to degree 32 is used. This means that the RAM 164 has the capacity to store at least 32 bytes therein. Each byte stored in the RAM 165 represents a separate code word (CW). Each code word is cycled through the generator 164 independent of the other code words. However, the code word associated with the first data byte of a first data sector (each data sector contains 32 bytes of data as shown in FIG. 7) is interleaved with the first data byte of a second data sector, the first data byte of a third data sector, and so on, up to the total number of sectors processed by the generator 164. This interleaving process is illustrated in FIG. 12. Because there are 247 sectors of user data, one PID sector, one Error Detection Sector, and six ECC sectors, in a long block of dats (See FIG. 7) there are 255 sectors of data, each with 32 bytes of "data" (information), that are processed by the generator circuit 164. Hence, each of the 32 code words held in the RAM 165 is interleaved—modified by the results of a prior operation—up to 255 times. The code words, CW; held in the RAM 165 after the completion of all these processing steps, thus respectively contain information derived from the respective bytes of each data sector. This compilation of information, as is explained below, provides the information needed to generate the remainder polynominal R(x) during encoding of the data block, and the syndrome polynominals $S_i(x)$ during decoding of the data block.

Advantageously, both the read multiplier 168 and the write multiplier 170 may be realized with PROM circuits that have programmed therein the precomputed results of the desired multiplication operation. Having these operations precomputed and stored in the PROMs in this fashion saves a significant amount of processing time. The operation performed by the PROM 168 (preprogrammed therein) is the solution to the generator polynominal g(x). The operation performed by the PROM 170 is the generation of the coefficients of the remainder polynominal R(x) as determined by the Chinese remainder theorem. Using the Chinese remainder theorem in this fashion is described in the book: Berlekamp, *Algebraic Conding Theory* (McGraw Hill, 1968).

The operation of the generator 164 will now be explained. During a write operation, a data byte from the data buffer 106 is directed to the main data bus 162 through the tri-state buffer 182. Once on the bus 162, the data is available to: (1) the DDS write buffer (see FIG. 9) where it is thereafter appropriately serialized by the serializer 133 and encoded by the 2-7 encoder 136; and (2) an input bus 163 of the ECC generator circuit 164 (where it is made available to each of the six generators). For the first 249 sectors of data, the tri-state buffer 176 prevents the output of the modulo two sum circuit 173 from being coupled to the main data bus 162, therby effectively disabling the write multiplier (PROM) 170. Hence, each data byte of each 249 sectors is interleaved, as described above, in a progressive fashion through the read multiplier (PROM) 168.

As the 250th sector (the first ECC RDS) enters the generator 164 to be processed, and continuing through the 255th sector, the tri-state register 176 is enabled. The output of the sum circuit 173 contains the coefficients of the remainder polynominal R(x), which coefficients are, according to the Reed-Solomon code selected, the encoded error correcting data bytes that are appended to the data (the previous 249 sectors) delivered to the write circuits.

During a read operation, data from the read DDS buffer 154 is passed through a tri-state buffer 184 to the main data bus 162. The data, on a byte-by-byte basis, is processed by the generator circuitry 164 in the same manner as described above during a write operation. The write multiplier (PROM) 170 is not enabled (i.e., the tri-state buffer 176 does not allow its output to be corrected to the data bus 162) at any time during a read operation. Each of the 32 code words held in the RAM 165 are combined with corresponding code words from the RAMs in the other five generators. From these 32 combined code words, six syndrome bytes are provided, thereby providing a total of 192 ECC bytes for each block of data. (The syndrome byte is the data byte held in the RAM 165 after the interleaving process is complete.) The syndrome or ECC bytes represent the coefficients of the syndrome polynominal $S_i(x)$, and as such, provide the necessary data for carrying out steps (2)-(4) of the error correcting decoding process.

The ECC processor 156 (FIG. 10) controls the operation of the generator 164 and carries out step (2) of the decoding process. That is, based on the syndromes provided by the generator 164, it calculates one to three sets of error pattern and position information per interleave. This information is passed to the functional microprocessor 96 which carries out the remaining steps (3) and (4) of the decoding process: it calculates the absolute position in the Data Buffer of each error and performs the actual correction. Because of this method of correction, each data block must be held in a data buffer 106 until the correction process is complete.

The ECC Processor 156 may be an 8×305 based design which executes instructions in 200 ns. As indicated, the 8×305 is a commercially available integrated circuit, which can be obtained from Signetics. To further enhance the reliability of the error correcting process, two error detection schemes are used to ensure data integrity throughout the data path: (1) parity checking; and (2) Error Detection Code which is written to the platter as described below.

All data passed throughout the data path carries a parity bit therewith. Parity is generated at the point at which the data is injected into the path, and checked at various key locations throughout the path.

In addition to parity checking, all source data entered into the Data Buffer 106 as part of a write operation, is also passed through an EDC generator 190 (FIG. 9) which calculates the number of bytes of error-checking information then entered into the Data Buffer as part of the logical block. This EDC information is written on the platter in the EDC RDS sector and protected by the EDC.

During the write operation, the Readback Check ciruitry passes the data through an EDC checker 192 on the output of the Read DDS Buffer 154. After the Data and EDC bytes are passed through the checker, the result in the checker should be zeroes. This check guarantees data integrity from the input of the Data Buffer, through the entire write path and back through the readback circuits.

On a Read operation, the data which has been recovered from the media, placed in the Data Buffer and corrected there by the functional processor, is checked in a checker circuit 194 as it is shifted out of the Data Buffer. This check is to protect against a large error which may have exceeded the correction span of the ECC and resulted in a false correction of the data.

Figure 13:
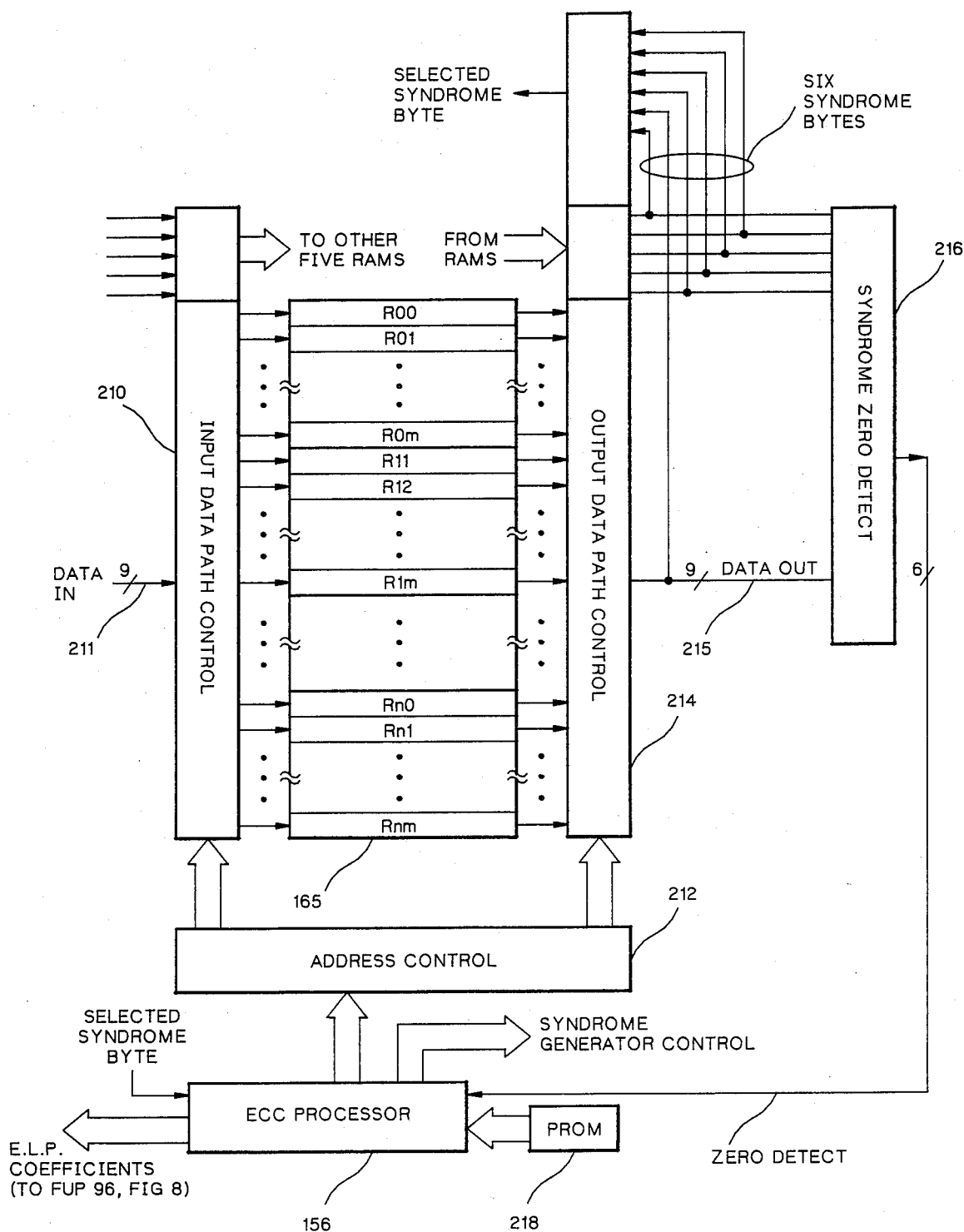
FIG. 13 is a diagram of the RAM circuit of FIG. 11.

Referring next to FIG. 13, there is shown a block diagram illustrating the organizational structure of the RAM 165 used within the preferred embodiment of the syndrome generator 164 (FIG. 11). The RAM is divided into a plurality of memory locations, 0, 1, 2, ... n, for each degree of interleave to be performed. Similarly, each interleave memory location is further divided into m memory locations. For the preferred embodiment, n is 32 and m is 8 (although m could be any integer greater than one). Address control logic 212 controls the input data path control 210 and the output data path control 214 so that a given byte of input data on the input data bus 211 can be selectively directed to any memory location within the RAM, and further so that any selected data byte stored within the RAM can be coupled to the data out bus 215. In this regard, it is noted that all six RAMs used within the ECC circuit 161 (only one of which is shown if FIG. 11) are accessed through these address control elements as though just one large RAM existed. The address control logic 212 receives instructions from the ECC processor 156 as to which memory locations, designated as RXY in FIG. 13 (where X represents the interleave number, and Y represents the location within the interleave number) are to be accessed. Access is performed on three levels: (1) the RAM (one of six); (2) the interleave (one of n); and (3) the subinterleave (one of m). There are numerous addressing techniques available in the art for carrying out the function illustrated by the control blocks 210, 212, and 214 in FIG. 13, and what is shown in FIG. 13 in this respect is only intented to illustrate one possible addressing concept that may be used, and is not to be taken in a limiting sense.

The purpose of adding the additional memory locations RX0 through RXm for each interleave is to allow the ECC decoding process to operate as fast as possible. As described previously, this ECC decoding process essentially comprises four steps, only the first step of which involves using the memory locations within the RAM 165 of the generator 164. The other steps, steps (2)-(4), may be carried out essentially independent of step (1) so long as the error syndromes are generated and available. However, it is possible that the entire error correction process may take longer than one block read time. Hence, in order to allow block reads and the ECC decoding process to be carried at the optimum speed, the additional memory locations are provided within each interleave memory section so that up to m syndromes may be generated corresponding to m blocks of data, for a specified degree of the interleave. That is, the first byte of data from the first through 255th data sectors of a first block of data may be processed (interleaved) as described previously with the results being stored in memory location R00; the first byte of data from the first through 255th data sectors of a second block of data may be processed (interleaved) with the results being stored in memory location R01; and so on.

As an additional feature of the present invention, zero detect logic 216 is employed to detect when any syndrome byte (which syndrome bytes comprise the data bytes stored in the RAM 165 after the interleave process for a given block of data has been completed) contains all zeros. (This detection is automatically done whenever the byte is addressed, and this function may be carried out within the ECC processor rather than in a separate logic block 216). If an addressed byte is zero, then a zero detect signal is sent to the ECC processor 156. This zero detect signal notifies the ECC processor 156, which is carrying out step (2) of the decoding process (i.e., generating the coefficients of the E.L.P.) that it may skip several steps involved in the decoding process, thereby saving valuable processing time.

To illustrate, if a decoding process of the type described in U.S. Pat. No. 4,142,174 is used (which process represents one of several techniques available to those skilled in the art for carrying out decoding step (2)) then the generation of the zero syndrome detect signal allows most of the left side of the flow diagram of FIG. 3 of U.S. Pat. No. 4,142,174 to be skipped.

As a further feature of the present invention, the encoding and step (1) of the decoding, both of which are carried out in the shared circuitry of FIG. 11, are made self-checking. That is, parity bits are carried along all of the data paths within the generator 164. This requires that the data paths be 9 bits wide rather than the conventional 8 bits wide. More particularly, parity bits are carried into the Read and Write Multipliers 168 and 170. Each of these elements is configured to generate an error flag, appearing on signal lines 168' and 170', whenever incorrect parity is sensed within the respective multiplier element. These error flags are sent to both the ECC processor 156 and the Functional processor 96 so that appropriate action may be taken in response to the error that has occurred. (Typically, a parity error of this type indicates a hardware failure, so the action taken is usually to notify the user through the host CPU.) When PROMs are used to realize the multiplier elements 168 and 170, parity error is detected by preprogramming the PROM with error flag information at those locations having an address corresponding to incorrect parity.

Because of the modulo two sum that is performed by the exclusive-or circuits 172 and 173, it is important that even parity be used throughout the ECC encoder/syndrome generator circuit 161. (This is because the modulo two sum of two numbers having even parity retains even parity, while the modulo two sum of two numbers having odd parity does not.)

The ECC Processor 156, as indicated previously, may be realized with an 8×305 processor chip available from Signetics. In the preferred embodiment, this processor chip 156, during an ECC mode of operation (the processor chip 156 also provides the write control function for the Write DDS Buffer 150, see FIG. 10) provides the following functions:

(1) Addresses the plurality of syndrome bytes stored in the RAM 165 (and the other corresponding RAMs of the other five generators) in order to select any of the data contained within any of the six RAMs, and any data contained in any of the memory locations of each of the 32 interleaves, within each RAM;

(2) provides the capability for detecting zero syndromes for any of the 32 interleaves;

(3) performs the required multiplication/division in the Galois Field using log and anti-log tables, in accordance with conventional ECC decoding processing techniques known in the art;

(4) solves a second order equation in the Galois Field using a quadratic root table;

(5) finds a cube root in the Galois Field using a cube root table; and (6) communicates with the functional microprocessor 96 the location of the error. (The functional processor 96 actually performs the error correction in response to the error location information—the E.L.P.—received from the ECC processor.)

No special programming techniques need be used in order to have the ECC processor 156 carry out the above functions. Those skilled in the ECC art are similar with the details of using microprocessors for carrying out these conventional ECC decoding functions (steps (2)–(4), referred to earlier). The various tables used by the ECC processor may be stored in a suitable storage element, such as the PROM 218 (FIG. 13.).

While the invention herein disclosed has been described by means of specific embodiments and applications thereof, numerous modifications and variations could be made thereto by those skilled in the art without departing from the spirit and scope of the present invention. It is therefore to be understood that within the scope of the appended claims, the invention may be practiced otherwise than as specifically described herein.

What is claimed is:

1. In a data processing system wherein digital data is stored by writing the data on storage media, and wherein said data may be subsequently retrieved by reading the data from the storage media, and further wherein, for error detection and correction purposes, the data is encoded with a Reed-Solomon code prior to writing it on the media and decoded after it is read from the media, a shared system for encoding and decoding the data, said system comprising:

storage means for storing at least a byte of data;

exclusive-or means for performing the modulo two addition of first and second data bytes, presented at first and second input ports thereof, the sum of which is a sum data byte that is coupled to an input port of said storage means;

first multiplication means coupled to an output port of said storage means for generating a first product data byte that is the product of the data byte stored in said storage means and other prescribed data;

second multiplication means coupled to the output port of said storage means for selectively generating a second product data byte that is the product of the data byte stored in a said storage means and other prescribed data;

means for coupling the first product data byte to the first input port of said exclusive-or means, whereby said first product data byte comprises one of the two data bytes summed by said exclusive-or means;

data byte combination means for generating a combined data byte as a prescribed function of a plurality of secondary data bytes presented thereto, one of said secondary data bytes comprising said second product data byte; and select means for selecting the select input data byte presented to the second input port of said exclusive-or means, said select means being adapted to choose the select input data byte from: (1) a data byte to be recorded on the storage media, or (2) a data byte read from the media.

2. The shared encoding/decoding system of claim 1 wherein said select means may further select the input data byte presented to the second input port of said exclusive-or means as the combined data byte generated by said data byte combination means.

3. The shared encoding/decoding system of claim 2 wherein said data byte combination means comprises a second exclusive or means for performing the modulo two addition of said secondary bytes.

4. The shared encoding/decoding system of claim 2 comprising a plurality of independent sets of said storage means, exclusive or means, first and second multiplication means, and coupling means, the second product data byte from each set being connected as one of the inputs to said data byte combination means, which said data byte combination means and said input data select means are shared by all of said sets.

5. The shared encoding/decoding system of claim 4 further including processing means for controlling the operation of said system, said processing means including:

means for addressing and selectively retrieving data bytes stored within each of said storage means within each of said sets; and means for performing additional operations of the data bytes thus retrieved.

6. The shared encoding/decoding system of claim 5 further including means for detecting when any of said retrieved data bytes comprise all zeros.

7. The shared encoding/decoding system of claim 1 further including self-checking means comprising a parity bit appended to each data byte that is processed and handled within said system; and means interspersed throughout said system for checking said parity bits.

8. The shared encoding/decoding system of claim 7 wherein said first and second multiplication means comprise first and second memory means respectively, each having a precomputed product stored therein at an address corresponding to one of the multiplicands of said respective product.

9. The shared encoding/decoding system of claim 8 wherein each of said first and second memory means include:
parity check means therewithin for identifying address bytes presented thereto containing incorrect parity; and
signaling means for generating a flag signal indicating that a parity error has occurred.

10. In a data handling system wherein digital data is stored by writing the data on storage media, and wherein said data may be subsequently retrieved by reading the data from the storage media, and further wherein, for error detection and correction purposes, the data is encoded with a prescribed code prior to writing it on the media and decoded after it is read from the media, a system for encoding and decoding the data, said system comprising:
storage means for selectively storing a plurality of bytes of data in separate storage locations;
exclusive-or means for performing the modulo two addition of first and second data bytes, presented at first and second input ports thereof, the sum of which is a sum data byte that is coupled to an input port of said storage means;
first multiplication means coupled to an output port of said storage means for generating a first product data byte that is the product of the data byte stored in said storage means and other prescribed data;
second multiplication means coupled to the output port of said storage means for selectively generating a second product data byte that is the product of the data byte stored in said storage means and other prescribed data;
means for coupling the first product data byte to the first input port of said exclusive-or means, whereby said first product data byte comprises one of the two data bytes sumed by said exclusive-or means;
means for coupling a select input data byte to the second input port of said exclusive-or means, whereby said input data byte comprises the other of the two data bytes sumed by said exclusive-or means;
data byte combination means for generating a combined data byte as a prescribed function of a plurality of second data bytes presented thereto, one of said secondary data bytes comprising said second product data byte;
select means for selecting the select input data byte presented to the second input port of said exclusive-or means, said select means being adapted to choose the select input data byte from a data byte to be recorded on the storage media or a data byte read therefrom; and
control means for controlling the operating of said storage means and select means, whereby a desired select input data byte is processed by said system and stored at a select location within said storage means.

11. The encoding/decoding system of claim 10 wherein said select means may further select the select input data byte presented to the second input port of said exclusive-or means as the combined data byte generated by said data byte combination means.

12. The encoding/decoding system of claim 11 wherein said prescribed code comprises an interleaved code, and wherein said storage means includes sufficient memory locations to store n data bytes, where n is the degree of the interleave of said code, whereby a separate storage location for each nth interleave is provided.

13. The encoding/decoding system of claim 12 wherein each nth storage location of said storage means is further subdivided into m sub-memory locations, each sub-memory location having the capacity to store a data byte, whereby said storage means may store m data bytes corresponding to the nth interleave data bytes of different data words, each data word comprising a plurality of data bytes.

14. In a digital data processing system wherein an error correction code is used to correct errors that occur in the reading or transmission of digital data throughout said system, and further wherein the error correction process includes the generating of syndrome bytes by a syndrome byte generator, which syndrome bytes are used in subsequent steps of the error correction process to identify the location of errors within data bytes and within blocks of data comprising prescribed sequences of said data bytes, and still further wherein the syndrome bytes are generated through an interleaving process that includes feeding into a data byte the results of a prior operation performed on a previously processed data byte of the same degree within the data block structure, a method of self-checking the syndrome byte generation process, said method comprising carrying a parity bit with each of the data bytes as they are processed through said syndrome byte generator, checking for correct parity at prescribed locations within the syndrome byte generator, and generating an error flag signal in the event that incorrect parity is sensed.

15. The self-checking method of claim 14 wherein the operations performed on said data bytes processed by said syndrome byte generator include multiplying the data byte by a prescribed multiplicand in a multiplying circuit, and adding the resultant product byte with the next data byte processed in a modulo two addition circuit, and further wherein incorrect parity is sensed within said multifplying circuit such that the multiplication operation is not carried out if incorrect parity is sensed.

16. The self-checking method of claim 15 wherein said multiplying circuit comprises a PROM having preprogramed therein a set of product bytes corresponding to the product of said prescribed multiplicand and an input multiplicand data byte, said input multiplicand data byte comprising one of the data bytes being processed by said interleaving process being performed by said syndrome byte generator, a particular product byte being stored within said PROM at an address corresponding to a matching input multiplicand data byte, whereby the correct product byte is retrieved by addressing the PROM with the input multiplicand data byte, and wherein incorrect parity is sensed and signaled by preprogramming within said PROM the error flag signal at all memory locations having an address within said PROM that corresponds to incorrect parity.

17. The self-checking method of claim 15 wherein even parity is used throughout said syndrome byte generator.

* * * * *